(12) United States Patent
Muir

(10) Patent No.: US 10,937,687 B2
(45) Date of Patent: Mar. 2, 2021

(54) AMORPHOUS METAL THIN FILM NONLINEAR RESISTOR

(71) Applicant: AMORPHYX, INC., Corvallis, OR (US)

(72) Inventor: Sean William Muir, Corvallis, OR (US)

(73) Assignee: Amorphyx, Inc., Corvallis, OR (US)

( * ) Notice: Subject to any disclaimer, the term of this patent is extended or adjusted under 35 U.S.C. 154(b) by 0 days.

(21) Appl. No.: 16/556,157

(22) Filed: Aug. 29, 2019

(65) Prior Publication Data

US 2019/0385894 A1 Dec. 19, 2019

Related U.S. Application Data

(63) Continuation of application No. 15/767,994, filed as application No. PCT/US2016/056653 on Oct. 12, 2016, now Pat. No. 10,438,841.

(Continued)

(51) Int. Cl.
*H01L 21/768* (2006.01)
*H01L 23/532* (2006.01)
(Continued)

(52) U.S. Cl.
CPC ........ *H01L 21/768* (2013.01); *G02F 1/13439* (2013.01); *G02F 1/134363* (2013.01);
(Continued)

(58) Field of Classification Search
CPC .............. H01L 21/768; H01L 21/3205; H01L 23/53209; H01L 27/124; H01L 27/1255;
(Continued)

(56) References Cited

U.S. PATENT DOCUMENTS 5,212,537 A 5/1993 Birang et al.
6,657,230 B1 12/2003 Murade
(Continued)

FOREIGN PATENT DOCUMENTS

JP H02-137828 A 5/1990
JP H06-230746 A 8/1994
(Continued)

OTHER PUBLICATIONS

Den Boer, "6.2: A Select Line Driver for the Offset-Scan-and-Hold Dual Select Diode AMLCDs," *Society for Information Display Symposium Digest of Technical Papers* 32(1):44-47, 2001.
(Continued)

*Primary Examiner* — Tu-Tu V Ho
(74) *Attorney, Agent, or Firm* — Seed IP Law Group LLP

(57) ABSTRACT

Amorphous multi-component metallic films can be used to improve the performance of electronic components such as resistors, diodes, and thin film transistors. Interfacial properties of AMMFs are superior to those of crystalline metal films, and therefore electric fields at the interface of an AMMF and an oxide film are more uniform. An AMMF resistor (AMNR) can be constructed as a three-layer structure including an amorphous metal, a tunneling insulator, and a crystalline metal layer. By modifying the order of the materials, the patterns of the electrodes, and the size and number of overlap areas, the I-V performance characteristics of the AMNR are adjusted. A non-coplanar AMNR has a five-layer structure that includes three metal layers separated by metal oxide tunneling insulator layers, wherein an amorphous metal thin film material is used to fabricate the middle electrodes.

20 Claims, 23 Drawing Sheets

Related U.S. Application Data

(60) Provisional application No. 62/241,038, filed on Oct. 13, 2015.

(51) Int. Cl.

| | | |
|---|---|---|
| *G02F 1/1343* | (2006.01) | |
| *H01L 49/02* | (2006.01) | |
| *H01L 27/12* | (2006.01) | |
| *H01L 29/49* | (2006.01) | |
| *H01L 21/3205* | (2006.01) | |
| *H01L 29/786* | (2006.01) | |
| *G02F 1/1362* | (2006.01) | |

(52) U.S. Cl.
CPC ........ *H01L 21/3205* (2013.01); *H01L 27/124* (2013.01); *H01L 27/1255* (2013.01); *H01L 28/24* (2013.01); *H01L 29/4908* (2013.01); *H01L 29/786* (2013.01); *G02F 2001/136295* (2013.01); *H01L 23/53209* (2013.01)

(58) Field of Classification Search
CPC ... H01L 28/24; H01L 29/4908; H01L 29/786; G02F 1/134363; G02F 1/13439; G02F 2001/136295
USPC .................................................. 257/774
See application file for complete search history.

(56) References Cited

U.S. PATENT DOCUMENTS

| | | |
|---|---|---|
| 8,035,169 B2 | 10/2011 | Ishida et al. |
| 8,378,937 B2 | 2/2013 | Iba et al. |
| 8,436,337 B2 | 5/2013 | Cowell, III et al. |
| 8,822,978 B2 | 9/2014 | Cowell, III et al. |
| 9,099,230 B2 | 8/2015 | Cowell, III |
| 9,818,605 B2 | 11/2017 | Yan et al. |
| 2003/0161181 A1 | 8/2003 | Saito et al. |
| 2006/0012000 A1 | 1/2006 | Estes et al. |
| 2006/0028591 A1 | 2/2006 | Kim |
| 2009/0015151 A1 | 1/2009 | Ishihara et al. |
| 2009/0134467 A1 | 5/2009 | Ishida et al. |
| 2010/0123744 A1 | 5/2010 | Iba et al. |
| 2010/0298005 A1 | 11/2010 | Yavuz et al. |
| 2010/0301480 A1* | 12/2010 | Choi .................. H01L 45/06 257/751 |
| 2011/0127525 A1 | 6/2011 | Yamazaki et al. |
| 2012/0074399 A1 | 3/2012 | Den Boer et al. |
| 2013/0288426 A1 | 10/2013 | Akimoto et al. |
| 2014/0048797 A1 | 2/2014 | Yu et al. |
| 2014/0191197 A1 | 7/2014 | Cowell, III et al. |
| 2014/0302310 A1 | 10/2014 | Cowell, III et al. |
| 2015/0055047 A1 | 2/2015 | Chang et al. |
| 2015/0115260 A1 | 4/2015 | Shieh et al. |
| 2015/0340511 A1 | 11/2015 | Yan et al. |
| 2016/0268526 A1 | 9/2016 | Facchetti et al. |
| 2017/0205656 A1 | 7/2017 | Lee et al. |
| 2018/0203309 A1 | 7/2018 | Cowell, III et al. |
| 2018/0308744 A1 | 10/2018 | Muir |
| 2019/0086280 A1 | 3/2019 | Jeon et al. |
| 2019/0088167 A1 | 3/2019 | Jeon et al. |

FOREIGN PATENT DOCUMENTS

| | | |
|---|---|---|
| JP | H10-84146 A | 3/1998 |
| JP | H11-305267 A | 11/1999 |
| JP | 2001-265255 A | 9/2001 |
| JP | 2008-4588 A | 1/2008 |
| JP | 2009-130167 A | 6/2009 |
| JP | 2010-123338 A | 6/2010 |
| WO | 2014/074360 A1 | 5/2014 |
| WO | 2018/009901 A1 | 1/2018 |

OTHER PUBLICATIONS

Grubbs et al., "Development and characterization of high temperature stable Ta-W-Si-C amorphous metal gates," *Applied Physics Letters* 97(22):223505, 2010. (3 pages).

Heiblum et al., "Ballistic hot-electron transistors," *IBM Journal of Research and Development* 34(4):530-549, 1990.

Heiblum, "Tunneling Hot Electron Transfer Amplifiers (Theta): Amplifiers Operating up to the Infrared," *Solid-State Electronics* 24(4):343-366, 1981.

Matsukawa et al., "Suppressing $V_t$ and $G_m$ Variability of FinFETs Using Amorphous Metal Gates for 14 nm and Beyond," *International Electron Devices Meeting*, San Francisco, California, USA, Dec. 10-13, 2012, pp. 8.2.1-8.2.4.

Mead, "Operation of Tunnel-Emission Devices," *Journal of Applied Physics* 32(4):646-652, 1961.

Nelson et al., "Hot-Electron Transfer through Thin-Film Al-$Al_2O_3$ Triodes," *Journal of Applied Physics* 37(1):66-76, 1966.

Ohmori et al., "Impact of Additional Factors in Threshold Voltage Variability of Metal/High-k Gate Stacks and Its Reduction by Controlling Crystalline Structure and Grain Size in the Metal Gates," *International Electron Devices Meeting*, San Francisco, California, USA, Dec. 15-17, 2008, pp. 1-4.

Torres, Jr. et al., "High-Current Gain Two-Dimensional $MoS_2$-Base Hot-Electron Transistors," *Nano Letters* 15(12):7905-7912, 2015.

Vaziri et al., "A Graphene-Based Hot Electron Transistor," *Nano Letters* 13(4):1435-1439, 2013.

Vaziri et al., "Going ballistic: Graphene hot electron transistors," *Solid State Communications* 224:64-75, 2015.

Zeng et al., "Vertical Graphene-Base Hot-Electron Transistor," *Nano Letters* 13(6):2370-2375, 2013.

\* cited by examiner

AMORPHOUS METAL THIN FILM NONLINEAR RESISTOR

BACKGROUND

Technical Field

The present disclosure relates to microelectronic devices that incorporate one or more layers of an amorphous metal film.

Description of the Related Art

Amorphous metals are rigid solid materials whose atomic structure lacks periodicity that characterizes crystalline materials. In an amorphous metal, formation of crystalline planes is suppressed, for example, by incorporating a plurality of components. Alternatively, this can be achieved with binary systems. Amorphous metals are often formed by fast quenching from a metal melt, or from a plasma by physical vapor deposition (i.e. sputtering). Having more elements can help enable slower quench speeds from melts, however when using a PVD from a plasma, quench speeds can be high enough that multiple elements are not as crucial. Even in a binary system, the elements can have very different sizes.

An example of an amorphous metal having four components—zirconium, copper, aluminum, and nickel—is $Zr_{55}Cu_{30}Al_{10}N_{15}$, described in U.S. Pat. No. 8,436,337. Amorphous metals can be identified by their resistivity measurements, which have shown that an amorphous metal material, while still conductive, has about ten times greater resistivity than its crystalline counterpart. Amorphous metals also have smoother surfaces than crystalline metals, as indicated by surface roughness measurements.

Amorphous multi-component metallic films (AMMFs), in the range of about 10-200 nm thick, can be used to improve the performance of electronic components such as resistors, diodes, and thin film transistors. Many deposition techniques that are well known in the art can be used to form AMMFs. For example, the exemplary AMMF $Zr_{55}Cu_{30}Al_{10}N_{15}$ can be formed on a substrate by conventional sputter deposition using four different metal targets. Alternatively, a single target source may be used. It is understood by those skilled in the art of thin films that the interfacial properties of AMMFs are superior to those of crystalline metal films, and therefore electric fields at the interface of an AMMF and an oxide film are more uniform. For example, such uniformity has produced superior current-voltage (I-V) characteristic curves for metal-insulator-metal (MIM) diodes and transistors that exhibit Fowler-Nordheim tunneling. The tunneling MIM diodes incorporate an AMMF as a lower electrode, and a crystalline metal film as an upper electrode. The two different electrodes are separated by a tunneling insulator that provides a one-way tunneling pathway for charge carriers to move from the lower amorphous electrode to the upper crystalline metal electrode. Various diode and transistor applications of AMMFs are discussed in U.S. Pat. Nos. 8,436,337 and 8,822,978.

Amorphous metal thin film non-linear resistors (AMNRs), having superior performance to existing thin film non-linear resistors, are discussed in U.S. Pat. No. 9,099,230 and PCT Patent Application No. WO2014/074360. Such AMNRs are of interest, in part, because their operation is independent of the polarity of the applied voltage, which is not true for other thin film resistors. Such polarity-symmetric AMNRs may provide improved signal control in liquid crystal display (LCD) or organic light emitting diode (OLED) display technologies and electromagnetic sensor arrays.

BRIEF SUMMARY

The present disclosure is directed to devices and systems that include a plurality of amorphous metal thin film interconnects having two or more active areas. The devices include at least three interconnects with each interconnect being on a different level of the device, or at least four interconnects formed on various levels of the device. Each device is a two-terminal device where ones of the interconnects are either the terminals or are coupled to the terminals.

These thin, high performing devices will replace transistors in display technology. As these devices can be made very efficiently, such as covering a smaller footprint relative to common transistor technologies, this will leave greater than 50% pixel window area for light to pass through.

Each active area includes three layers, a first amorphous metal thin film interconnect, a tunneling insulator on the first amorphous metal thin film interconnect, and a second interconnect on the tunneling insulator and overlapping with a portion of the first amorphous metal thin film interconnect. The second interconnect may be an amorphous metal thin film interconnect, a crystalline metal thin film interconnect, or a transparent conducting oxide thin film.

To achieve two or more active areas, the systems include a first amorphous metal thin film interconnect and a second metal thin film interconnect that are each overlapped by a third interconnect. An area associated with the overlap of the third interconnect with the first and second interconnects is the "active area." The third interconnect may be over the first interconnect and positioned under the second interconnect. A variety of configurations are possible and are discussed in further detail below.

These two-terminal devices may be integrated into displays to improve performance. These devices allow for an increase in a threshold voltage without increasing the thickness of the dielectric layer formed between the interconnects. A specific thickness is important to ensure Fowler-Nordheim conduction is achieved. A dielectric layer thickness too large or too small can affect the conduction and prevent proper operation of these devices. These devices can operate at higher voltages than single active area devices. This can increase a number of tunnel junctions and thus increase the voltage.

These devices using amorphous metal thin film interconnects have advantageous properties such as symmetrical current and voltage properties. In addition, by adding more active areas and adjusting a size of the active areas, the devices can be tuned to a selected capacitance and threshold voltage, while maintaining the same tunneling insulator thickness. A device with only two active areas may be able to achieve a threshold voltage of around 5 volts, where a device with twelve active areas may be able to achieve a threshold voltage of around 30 volts. For an even number of active areas, voltage symmetry is maintained. For an odd number of active areas voltage response is asymmetric. As such, asymmetric AMNR devices for certain applications can be created.

These can be active electronics without any semiconductor materials. The devices are formed on glass layers and use amorphous metal thin films with tunneling insulators to form these active electronics.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

DETAILED DESCRIPTION

It will be appreciated that, although specific embodiments of the present disclosure are described herein for purposes of illustration, various modifications may be made without departing from the spirit and scope of the present disclosure. Accordingly, the present disclosure is not limited except as by the appended claims.

In this description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Figure 1:
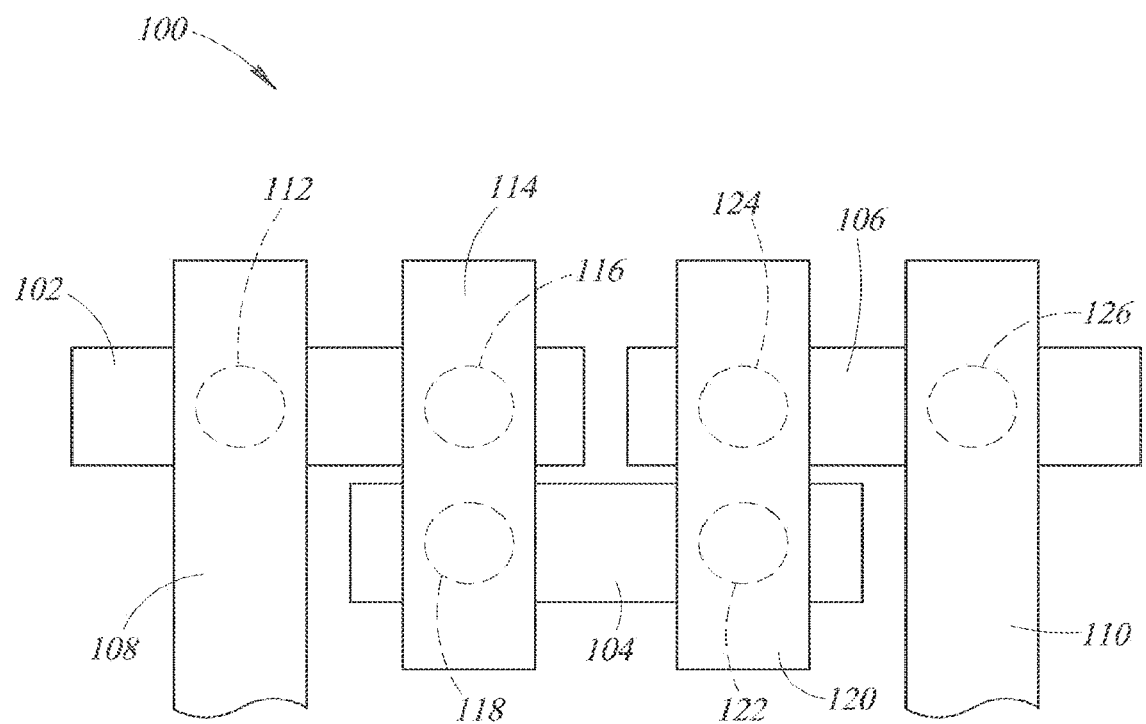
FIG. 1 is a top plan view of a device having six (n=6) active areas according to an embodiment of the present disclosure.

FIG. 1 is a top plan view of a device 100 formed in accordance with embodiments of the present disclosure. These devices are multi-tunnel junction amorphous metal thin film non-linear resistors (AMNR).

The device 100 includes six active areas, which are areas where interconnects overlap. The device 100 includes a first interconnect 102, a second interconnect 104, and a third interconnect 106, each of which are amorphous metal thin film layers. The device 100 includes a fourth interconnect 108 and a fifth interconnect 110, which are coupled to an external power source, such as power or ground. The fourth interconnect 108 and the fifth interconnect 110 are two terminals of the device. Although not visible in FIG. 1, there is a dielectric between each of the interconnects at the active regions. This will be described in more detail below.

The fourth interconnect 108 overlaps a first portion of the first interconnect to form a first active area 112. A sixth interconnect 114 overlaps a second portion of the first interconnect 102 to form a second active area 116. The sixth interconnect overlaps a first portion of the second interconnect 104 to form a third active area 118. A seventh interconnect 120 overlaps a second portion of the second interconnect to form a fourth active area 122. The seventh interconnect 120 overlaps a first portion of the third interconnect 106 to form a fifth active area 124. The fifth interconnect overlaps a second portion of the third interconnect 106 to form a sixth active area 126.

The fourth interconnect 108, the fifth interconnect 110, the sixth interconnect 114, and the seventh interconnect 120 may be of the same amorphous metal thin film as the first, second, and third interconnects 102, 104, 106. Alternatively, the fourth interconnect 108, the fifth interconnect 110, the sixth interconnect 114, and the seventh interconnect 120 may be a different material, such as a crystalline metal thin film interconnect or a transparent conducting oxide thin film.

In FIG. 1, the first, second, and third interconnects 102, 104, 106 are formed in a first plane and the fourth, fifth, sixth, and seventh interconnects 108, 110, 114, and 120 are formed on a second plane that is above the first plane. The first plane may be above the second plane in a different embodiment. In addition, as shown in later figures, such as FIG. 4C, the fourth, fifth, sixth, and seventh interconnects 108, 110, 114, and 120 may be on different planes.

Each pair of two active areas associated with one of the interconnects that is an amorphous metal thin film may be considered an amorphous metal thin film resistor (AMNR), such that when there are six active areas, there are three AMNR devices.

Figure 2:
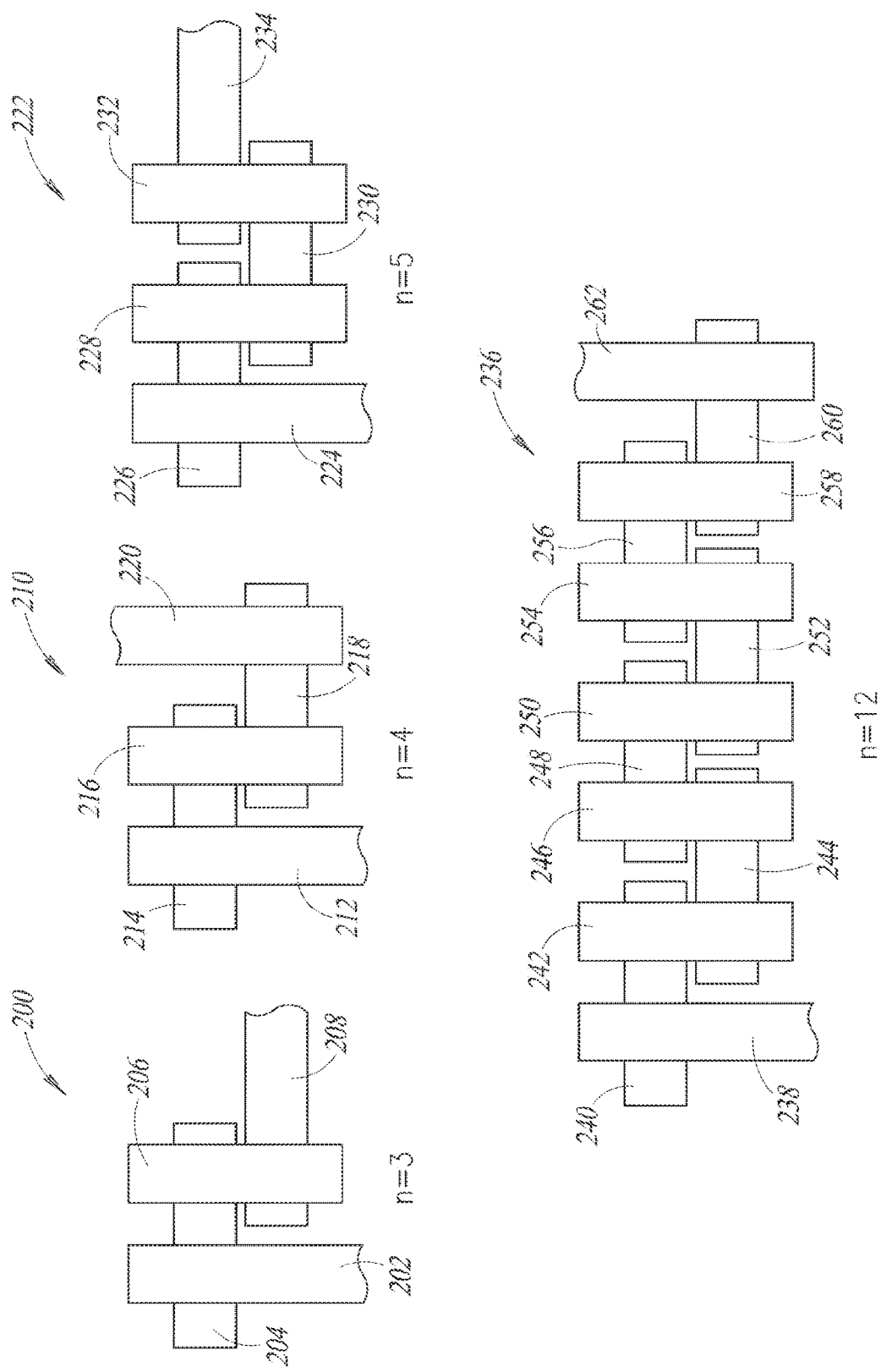
FIG. 2 includes top plan views of devices having 3, 4, 5, and 12 active areas, respectively.

FIG. 2 includes top plan views of devices having configurations with 3, 4, 5, and 12 active areas, respectively. In each of these configurations, there are at least two levels or layers of interconnects, i.e., not all of the interconnects are coplanar. Each of these configurations have two terminals. Some of the interconnects are formed on a first level or layer in the device while a different group of the interconnects are formed on a second level or layer of the device. There may be more than two levels in the device on which different ones of the interconnects are formed.

A first configuration 200 includes four interconnects, 202, 204, 206, 208. The first interconnect 202 and the fourth interconnect 208 are coupled between a control signal line and ground. The second interconnect 204 overlaps with the first interconnect 202. The third interconnect 206 overlaps with the second interconnect and with the fourth interconnect such that this configuration has three active regions (n=3). Each of the interconnects may be an amorphous metal thin film or the second and third interconnects may be an amorphous metal thin film while the first and fourth are a different conductive material.

A second configuration 210 includes four active areas (n=4) formed from five interconnects, 212, 214, 216, 218, 220. A third configuration 222 includes five active areas (n=5) formed from six interconnects, 224, 226, 228, 230, 232, 234. A fourth configuration 236 includes 12 active areas (n=12) formed from thirteen interconnects, 238-262. Any number of active areas is achievable and as can be seen from the configurations above, if the active area is n then a number of interconnects to achieve the active areas n is n+1.

Figure 3:
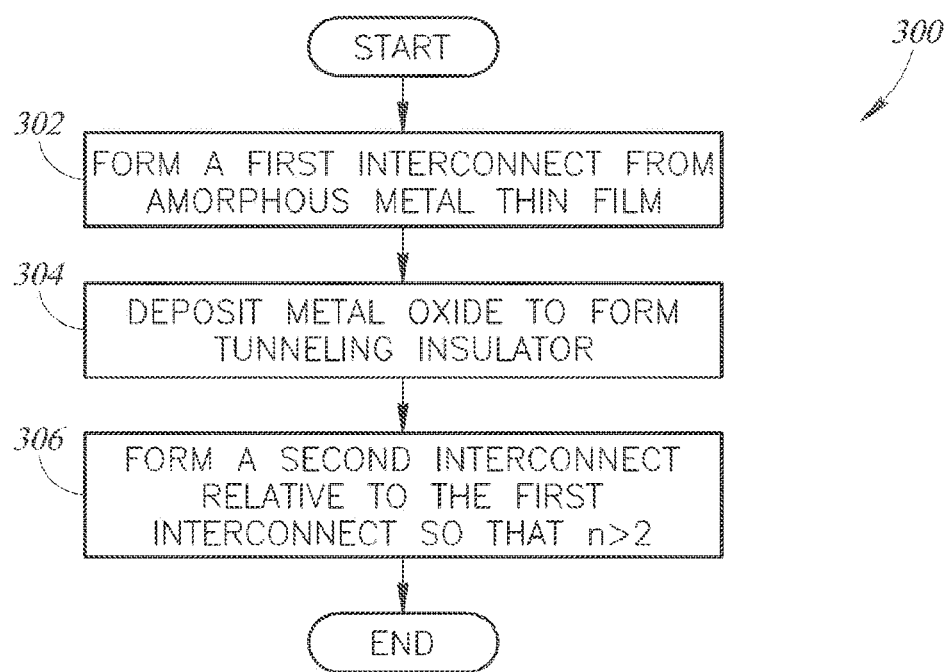
FIG. 3 is a flow diagram of a process to fabricate devices having more than two active areas, according to an embodiment as described herein.

The devices in the present disclosure are non-linear, i.e., non-coplanar, in that not all of the interconnects are formed on a single level or plane. FIG. 3 is a flow diagram of a process 300 to fabricate devices having more than two active areas, according to an embodiment as described herein, such as the device 100 in FIG. 1. The process includes a first step 302 where one or more first interconnects are formed on a substrate. The first interconnect is an amorphous metal thin film material. This first interconnect is first deposited as a layer of amorphous metal thin film material, such as by physical vapor deposition. The layer is then patterned, by either shadow masking, photolithography, or any suitable masking techniques. If photolithography is used the etchant choice may be a wet or dry etch.

In a second step 304, a tunneling insulator is formed, which is preferably a metal oxide formed by deposition, such as by atomic layer deposition, chemical vapor deposition, plasma enhanced chemical vapor deposition, and solutions deposition. This tunneling insulator has a preferred thickness, which is in the range of 5 and 15 nanometers depending on the material selected. Aluminum oxide is one option.

Next, in a third step 306, one or more second interconnects are formed on the tunneling insulator in a configuration where there are two or more active areas. These steps can be performed in different orders to achieve the various embodiments described in the present disclosure.

The second interconnects are a conductive material, which may be an amorphous metal thin film, a crystalline metal thin film, or a transparent conductive oxide thin film. This layer is used to form the terminals. This layer is deposited, such as by physical vapor deposition. Patterning may be used, such as lithography using wet or dry etches or shadow-masking may be used to form a selected shape of the lower electrode.

Figure 4A:
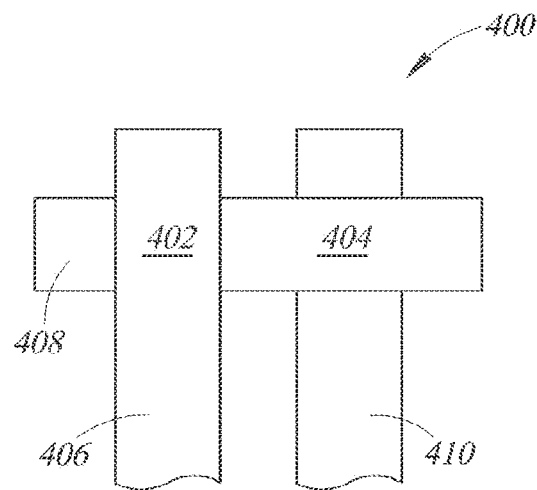
FIGS. 4A-4C are top down views of different configurations of non-coplanar devices according to the present disclosure.
Figure 4B:
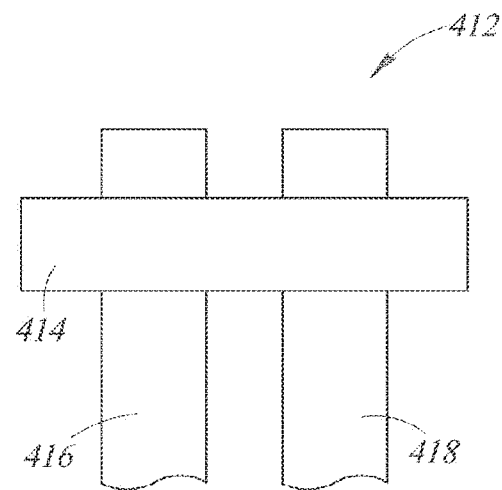
Figure 4C:
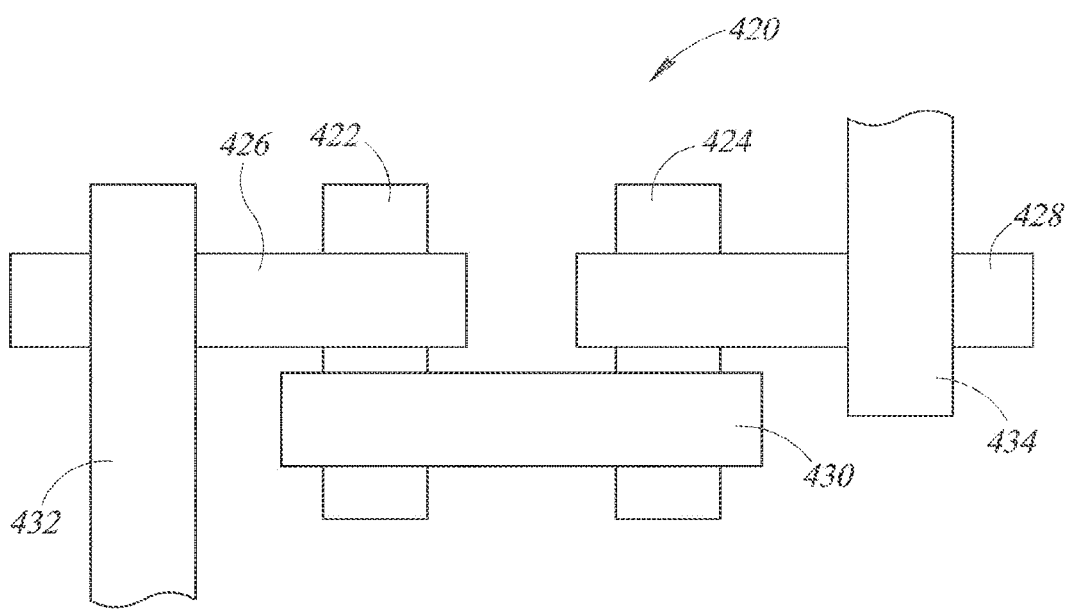

FIGS. 4A-4C are top down views of different configurations of non-coplanar devices according to the present disclosure. FIG. 4A is a configuration 400 having two active areas 402, 404, formed from three interconnects 406, 408, 410, which are each formed on a different plane. Interconnect 410 is formed on a first plane, interconnect 408 is formed on a second plane that is on the first plane, and interconnect 406 is formed on a third plane that is on the second plane. Each of these interconnects may be amorphous metal thin films. At least the interconnect 408 is an amorphous metal thin film.

FIG. 4B is a configuration 412 that includes two active areas with three interconnects 414, 416, 418. A first and second interconnect 416, 418 are formed on a lower plane with a third interconnect 414 being formed above the first and second interconnects, formed on an upper plane. The third interconnect 414 is an amorphous metal thin film.

FIG. 4C is a configuration 420 with six active regions with seven interconnects that are formed on at least three different levels. A first and second interconnect 422 and 424 are formed on a first or lowest level. A third and fourth interconnect 426 and 428 are formed on a second or middle level. A fifth interconnect 430 is formed either on the second level or on a third level that is above the second level. A sixth and seventh interconnect 432 and 434 are formed on the third level or a fourth level above the third level. As has been described above, a variety of levels can be achieved such that the amorphous metal layer is not necessarily the lowest interconnect in the stack of interconnects. In this configuration, the third interconnect 426, the fourth interconnect 428, and the fifth interconnect 430 may be amorphous metal thin films.

Figure 5:
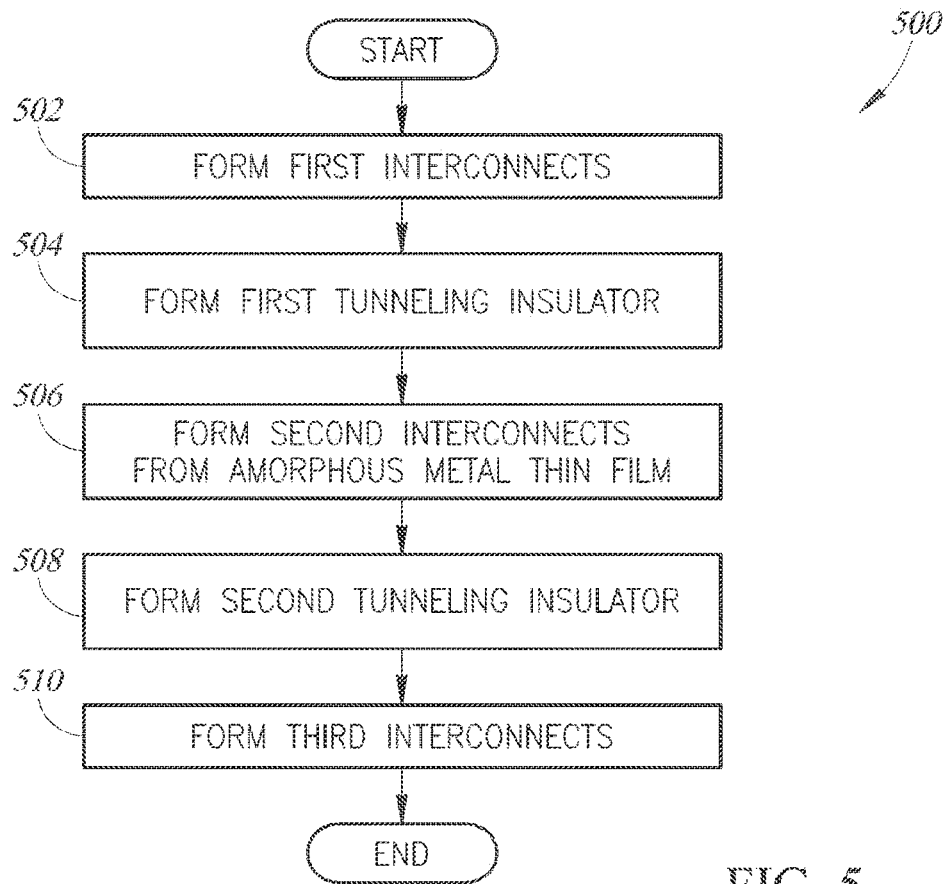
FIG. 5 is a flow diagram of a fabrication process to form a non-coplanar device according to an embodiment as described herein.

FIG. 5 is a process 500 to form an amorphous metal thin film non-planar resistor according to an embodiment of the present disclosure. The process begins by forming one or more first interconnects on a substrate at step 502. These first interconnects are a conductive material. Next, at step 504, a first tunneling insulator layer is formed on the first interconnects.

At step 506 one or more second interconnects are formed on the first tunneling insulator layer, where the second interconnects are formed from an amorphous metal thin film. At step 508, a second tunneling insulator is formed on the second interconnects. At step 510, one or more third interconnects are formed on the second tunneling insulator. The third interconnects are conductive and as with the first interconnects are not necessarily an amorphous metal thin film.

Figure 6:
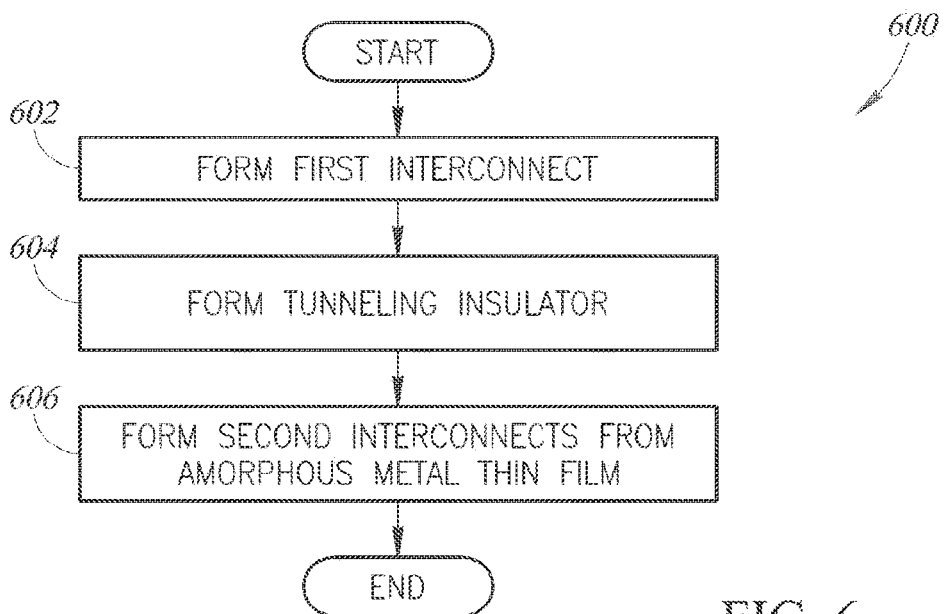
FIG. 6 is a flow diagram of a fabrication process to form a device according to another embodiment as described herein.

FIG. 6 is a process 600 to form an inverted amorphous metal thin film resistor in that the process includes forming, at step 602, one or more first interconnects on a substrate where these interconnects are conductive, but are not necessarily an amorphous metal thin film. Then, at step 604 a tunneling insulator layer is formed on the first interconnects. Then, at step 606, one or more second interconnects are formed on the tunneling insulator where the second interconnects are an amorphous metal thin film.

Figure 7A:
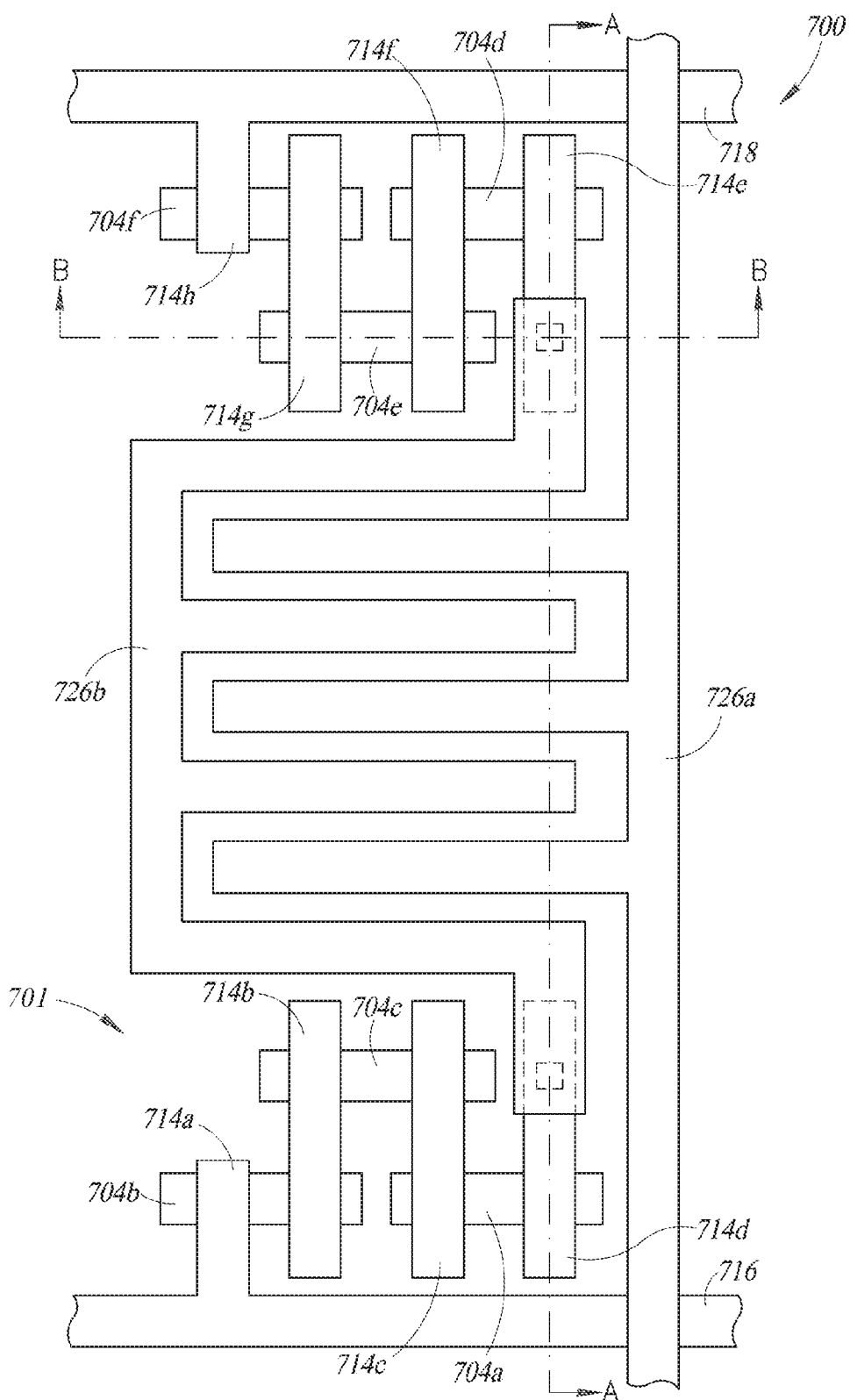
FIGS. 7A, 7B, and 7C are views of a pixel with in-plane switching according to an embodiment of the present disclosure.
Figure 7B:
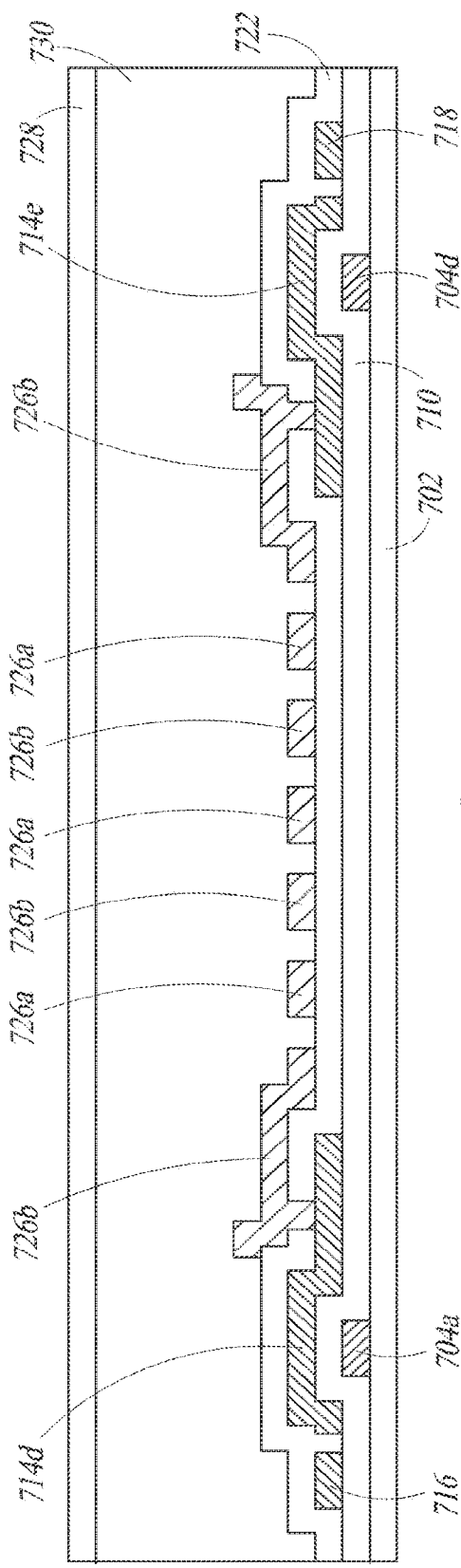
Figure 7C:
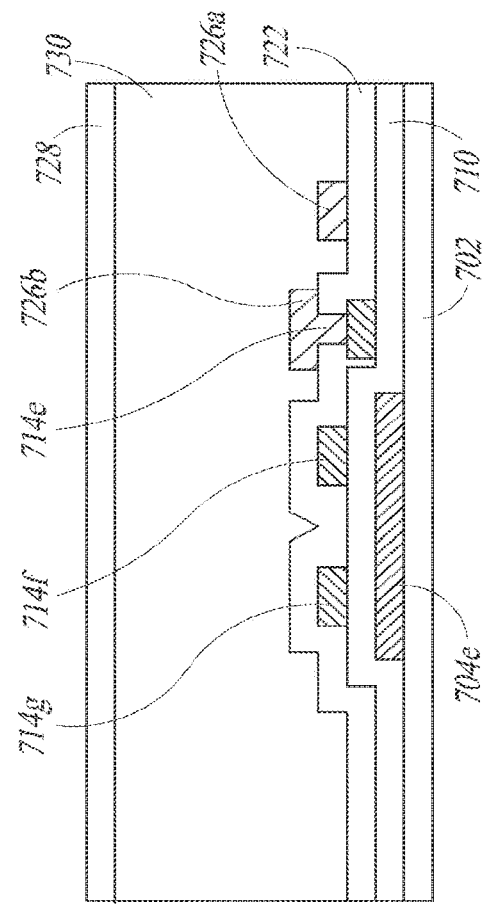
Figure 7D:
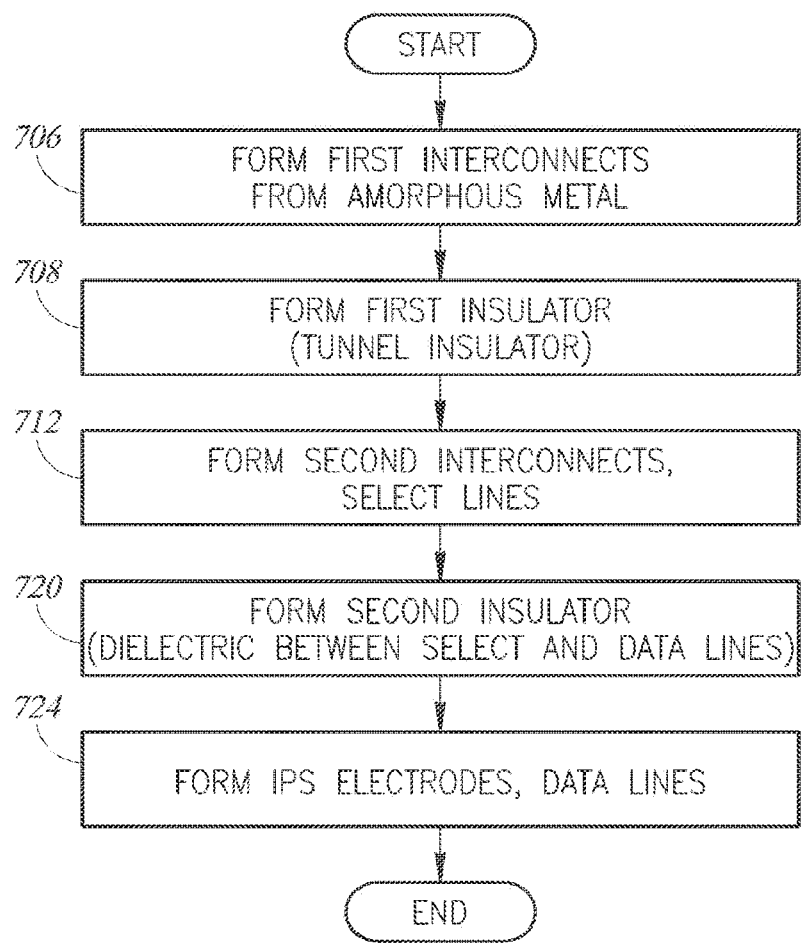
FIG. 7D is a process associated with forming FIGS. 7A, 7B, and 7C.

FIGS. 7A, 7B, and 7C are top and cross-sectional views of a pixel including AMNR devices formed in accordance with the present disclosure. These devices can be used for in-plane switching (IPS). FIG. 7D is a process associated with forming FIGS. 7A, 7B, and 7C. As used in the disclosure, pixel may refer to a pixel or a sub-pixel.

FIG. 7A is a top view of a pixel 700 that includes a plurality of AMNR devices 701. FIG. 7B is a cross-sectional view of the pixel 700 through the line A-A. FIG. 7C is a cross-sectional view of the pixel 700 through the line B-B. The pixel 700 is formed on a substrate 702, which is transparent or otherwise able to transmit light from a light source. A first plurality of interconnects 704a-704f are formed on the substrate 702 at step 706. In this embodiment, the first plurality of interconnects 704a-704f are all formed of an amorphous metal thin film.

At step 708, a first tunnel insulator 710 is formed over the first plurality of interconnects. At step 712, a second plurality of interconnects 714a-714h are formed on the first tunnel insulator 710. Select lines 716 and 718 can be formed at the same time as the second plurality of interconnects 714a-714h.

At step 720, a second insulator 722 is formed on the second plurality of interconnects 714a-714h. The second insulator may be a different material than the first tunnel insulator. At step 724, a plurality of in-plane electrodes 726a and 726b are formed on the second insulator. A top glass layer 728 is positioned over an LCD layer 730. The electrode 726a is also a data line. With this in-plane switching configuration, the data line is formed on the substrate as opposed to on the top glass layer 728.

The electrodes 726a and 726b are formed to have a comb fingered shape. There may be fewer or greater numbers of comb fingers as the application of this pixel may dictate.

Figure 8A:
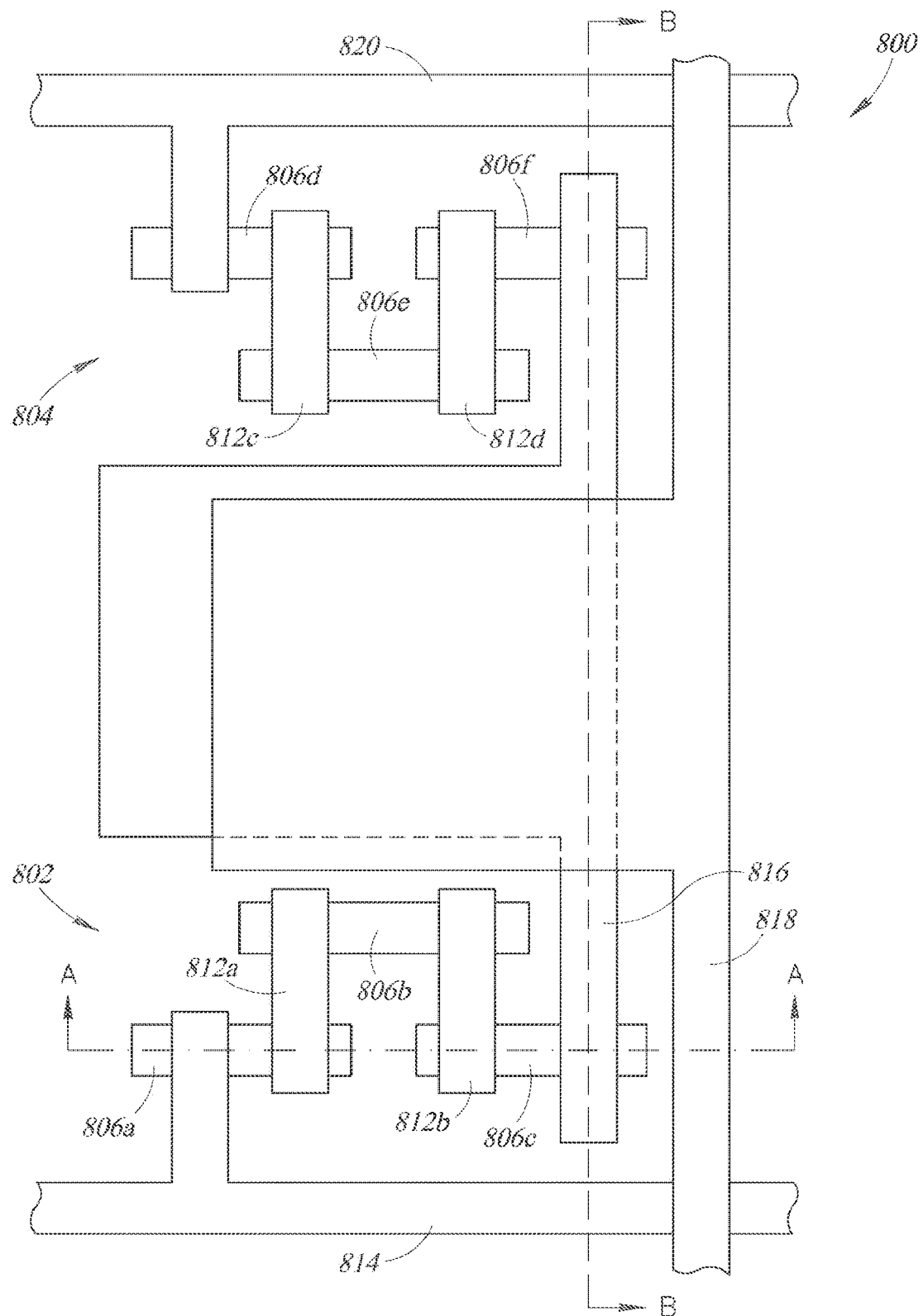
FIGS. 8A-8C are top and cross-sectional views of a vertical alignment (VA) pixel according to another embodiment of the present disclosure.
Figure 8B:
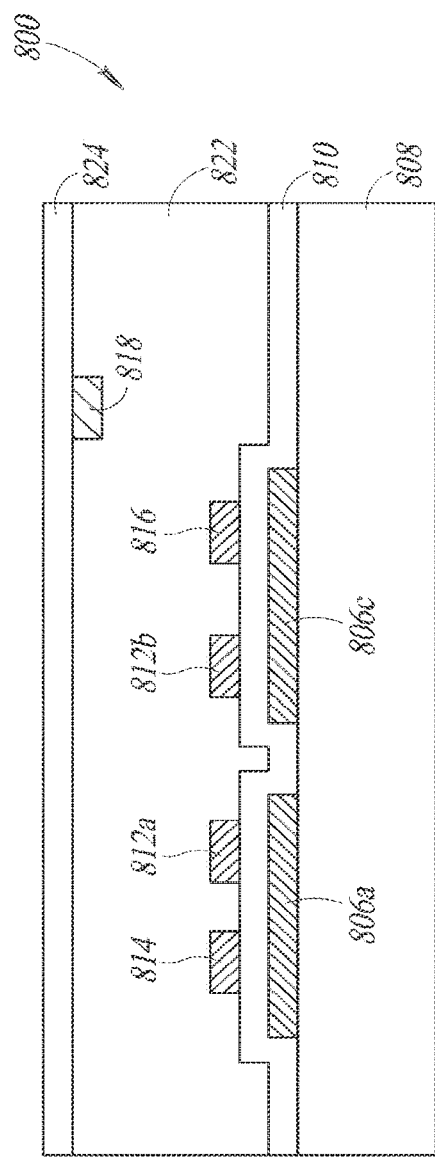
Figure 8C:
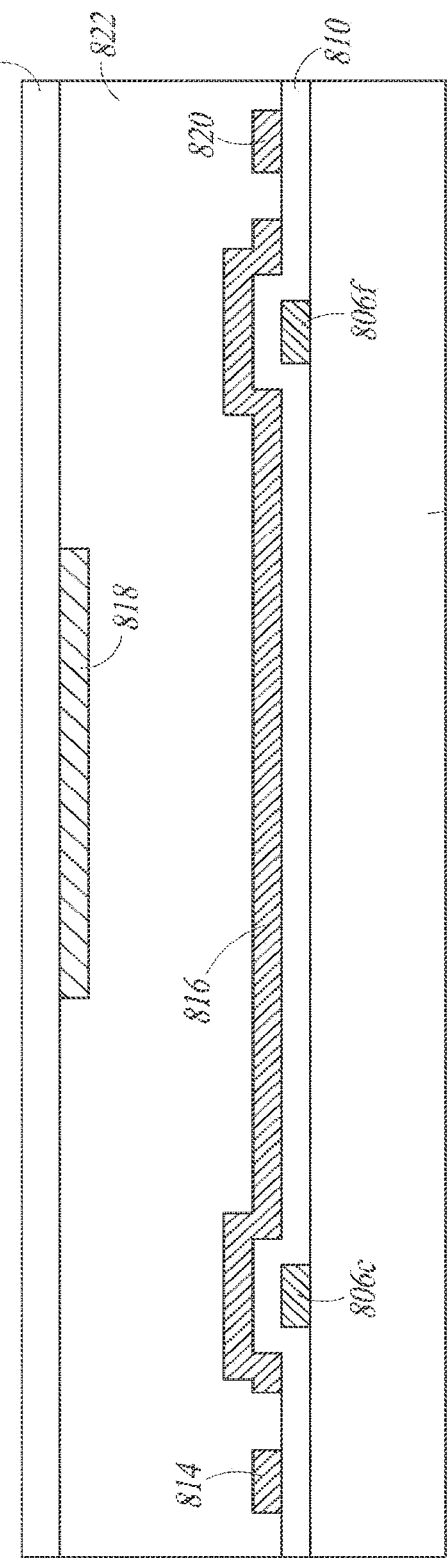

FIGS. 8A-8C are top and cross-sectional views of a vertical alignment (VA) pixel 800 according to another embodiment of the present disclosure. This pixel 800 includes a first AMNR device 802 with six active areas and a second AMNR device 804 with six active areas. In other embodiments, the first AMNR device may have a different number of active areas as compared to the second AMNR device. First interconnects 806a-806f are formed on a first glass layer 808. These first interconnects are amorphous metal thin films, which is a very planar, smooth material that simplifies the manufacturing process. Next, a tunneling insulator 810 is formed on the first interconnects.

Second interconnects 812a-812d are formed on the tunneling insulator 810. Additional signals lines 814 and 820 may be formed at the same time as the second interconnects 812a-812d. In addition, a first electrode 816 may also be formed at the same time as the second interconnects 812a-812d. A liquid crystal layer or other display material layer 822 is formed on the first electrode and the second interconnects 812a-812d.

A second electrode 818 is formed on a second glass layer 824. The first and second electrodes are staggered in this embodiment; however the electrodes may be aligned with each other such that from a top view, the second electrode would obscure at least a central portion of the first electrode. In this embodiment, the first and second electrodes are generally square in shape; however other shapes are envisioned. These electrodes may also be comb fingered.

FIG. 8A includes the first AMNR device 802 and the second AMNR device 804 with each having six active areas. The pixel 800 can be formed with only two active areas per AMNR device. For example, if only two of the first interconnects are formed, the pixel would include the interconnects 806a and 806d where extensions of the electrode 816 would overlap the interconnects 806a and 806d.

Said differently, the pixel may include the following: a first glass layer (substrate 808), a first and second amorphous metal thin film interconnect (interconnects 806a and 806d) on the first glass layer, a first electrode (electrode 816) on the first glass layer, the first electrode being coupled between the first and second amorphous metal thin film interconnects, a second electrode (electrode 818), and a second glass layer 824, the second electrode on the second glass layer. As the demands of the pixel change, the design may change such that various combinations of interconnects and numbers of active areas can be achieved by combining different numbers of interconnects.

A process to build such a pixel with a vertical alignment and two active areas per AMNR device is a simple process, where no semiconductors are needed. The process to build the pixel, when the pixel is used in a display, is referred to as building a backplane. This backplane includes depositing and patterning the amorphous metal thin film interconnects on the first glass layer. Next, a tunneling insulator is deposited. Next, the first electrode is deposited and patterned. The second electrode is formed on the second glass layer by depositing and patterning. The second glass layer can be color filter glass. This second electrode may be indium tin oxide.

Select lines for the pixel may be formed at the same time as the first electrode. In an alternative embodiment, the select lines are formed first and then the first electrode is formed and coupled to the select lines. The select lines of FIG. 8A are lines 820 and 814 and may include the second interconnects 812a-812d. The select lines may be coupled to the first electrode through vias, which will be explained in more detail below.

If the second electrode is a non-transparent conductor, four mask steps are used in the process to form the pixel with two AMNR devices each having two active areas. The pixel window material must be formed from a transparent conducting oxide. The process includes depositing and patterning an amorphous metal thin film to form a first and a second interconnect that are spaced by a distance. This is the first mask step. The process includes forming a tunnel insulator and then depositing and patterning select lines above and overlapping the first and second interconnects. This is the second mask step. An insulator is formed over the select lines. Vias are formed through the insulator to provide access to ones of the select lines. The first electrode is then formed by depositing and patterning a conductive material and is coupled to the ones of the select lines through the vias. This is the third mask step. The second electrode is formed on the second glass layer using a conducting oxide. This is the fourth mask step. A liquid crystal layer is positioned between the first and the second electrode. Alternatively, a two-tone mask may be used to reduce a number of mask steps. This two-tone mask may be used when forming the select lines and the first electrode.

The AMNR devices can be fully formed after only two masking steps. These amorphous metal thin film materials are very smooth, so they are excellent materials to start a manufacturing process with, as subsequent steps have a consistent surface to build on. These amorphous metal thin films are often the first layer formed; however, other configurations are envisioned, as described further in this disclosure.

A total height of the AMNR device from a top surface of the substrate to a top surface of the second level of interconnects is around 200 nanometers. These are very thin, high performing devices. These AMNR devices can be included on flexible displays.

An AMNR device with only two active areas may be able to achieve a threshold voltage of around 5 volts, where a device with twelve active areas may be able to achieve at threshold voltage of around 30 volts where each device has a similar or identical thickness of the tunneling insulator.

The threshold voltage relationship between two AMNR devices with different numbers of active areas is:

$$V_{Threshold\ AMNR\ X\#2} = V_{Threshold\ AMNR-X\#1} * (n_{AMNR-X\#2} / n_{AMNR-X\#1})$$

Where AMNR-X#1 is the first AMNR device and AMNR-X#2 is the second AMNR device and n is the number of active areas.

The capacitance relationship between two AMNR devices with different numbers of active areas is:

$$Capacitance_{AMNR\text{-}X\#2} = CapaCitanCe_{AMNR\text{-}X\#1} * (n_{AMNR\text{-}X\#1}/n_{AMNRX\#2})$$

where AMNR-X#1 is the first AMNR device and AMNR-X#2 is the second AMNR device and n is the number of active areas.

Figure 8D:
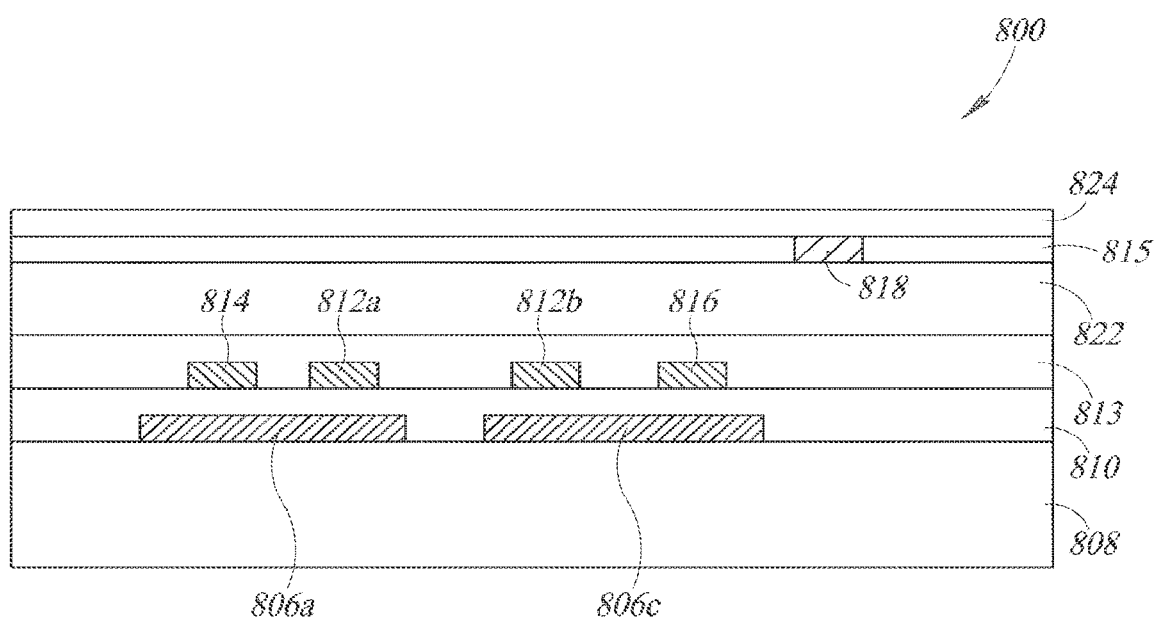
FIG. 8D is an alternative cross-sectional view of the vertical alignment pixel of FIG. 8A formed using different processing techniques.

FIG. 8D is an alternative cross-sectional view of the vertical alignment pixel of FIG. 8A formed using different processing techniques. In particular, FIG. 8D includes planarization steps in the process such that layers are not conformal as they are in FIG. 8B. FIG. 8D is a cross-sectional view through line A-A of FIG. 8A with planarized layers.

The first interconnects 806a and 806c are formed on the glass layer 808. The tunneling insulator 810 is formed over the first interconnects and planarized to form the selected thickness. The second interconnects 812a, 812b and select lines 814, 816 and the electrode 816 are formed on the planarized tunneling insulator 810. A dielectric layer 813 is formed over the second interconnects and select lines and then planarized. The liquid crystal layer 822 is on the dielectric layer 813. The second electrode 818 is formed on the second glass layer 824 and is surrounded on sides by a dielectric layer 815 to make a top surface, the electrode co-planar with a top surface of the dielectric.

Figure 9:
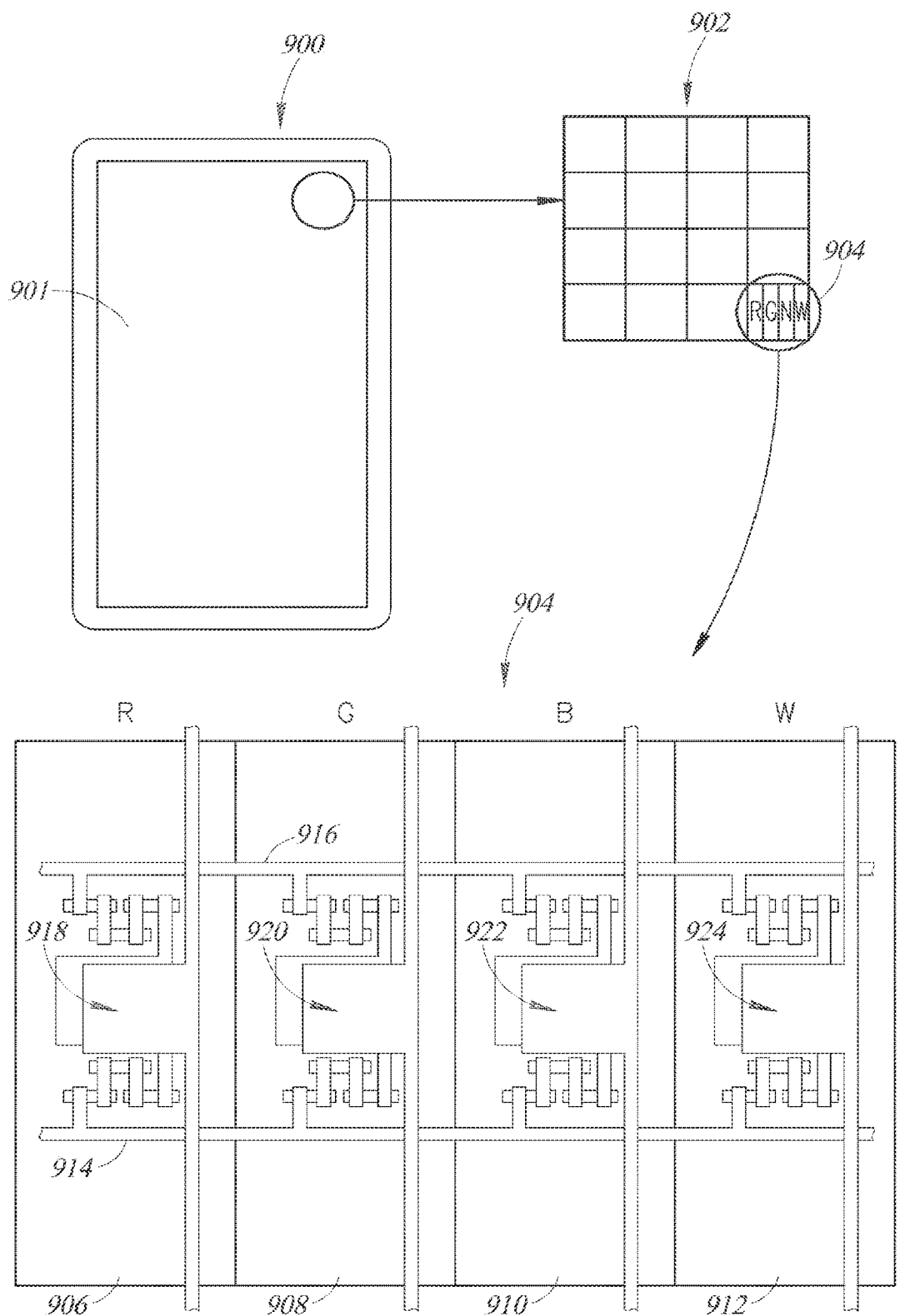
FIG. 9 includes a device with a screen having pixels formed in accordance with the present disclosure and enhanced views of the pixels.

FIG. 9 includes a device 900 with a screen 901 having an array 902 of pixels 904 formed in accordance with the present disclosure. The device may be any electronic device that includes a display, such as a television, a computer, a mobile phone, a tablet, or other device that includes pixels. Each pixel 904 includes a red sub-pixel 906, a green sub-pixel 908, and a blue sub-pixel 910. Some embodiments will include a white sub-pixel 912. The sub-pixels are illustrated as having a vertical alignment configuration; however, any configuration is envisioned such that the sub-pixel is formed using multiple AMNR devices having at least one active area. The illustrated configuration includes two AMNR devices in each color where each AMNR device includes six active areas. Select lines 914 and 916 are shared across adjacent pixels and sub-pixels. The top electrode or second electrodes 918, 920, 922, 924 are coupled in columns to other adjacent pixels.

Figure 10A:
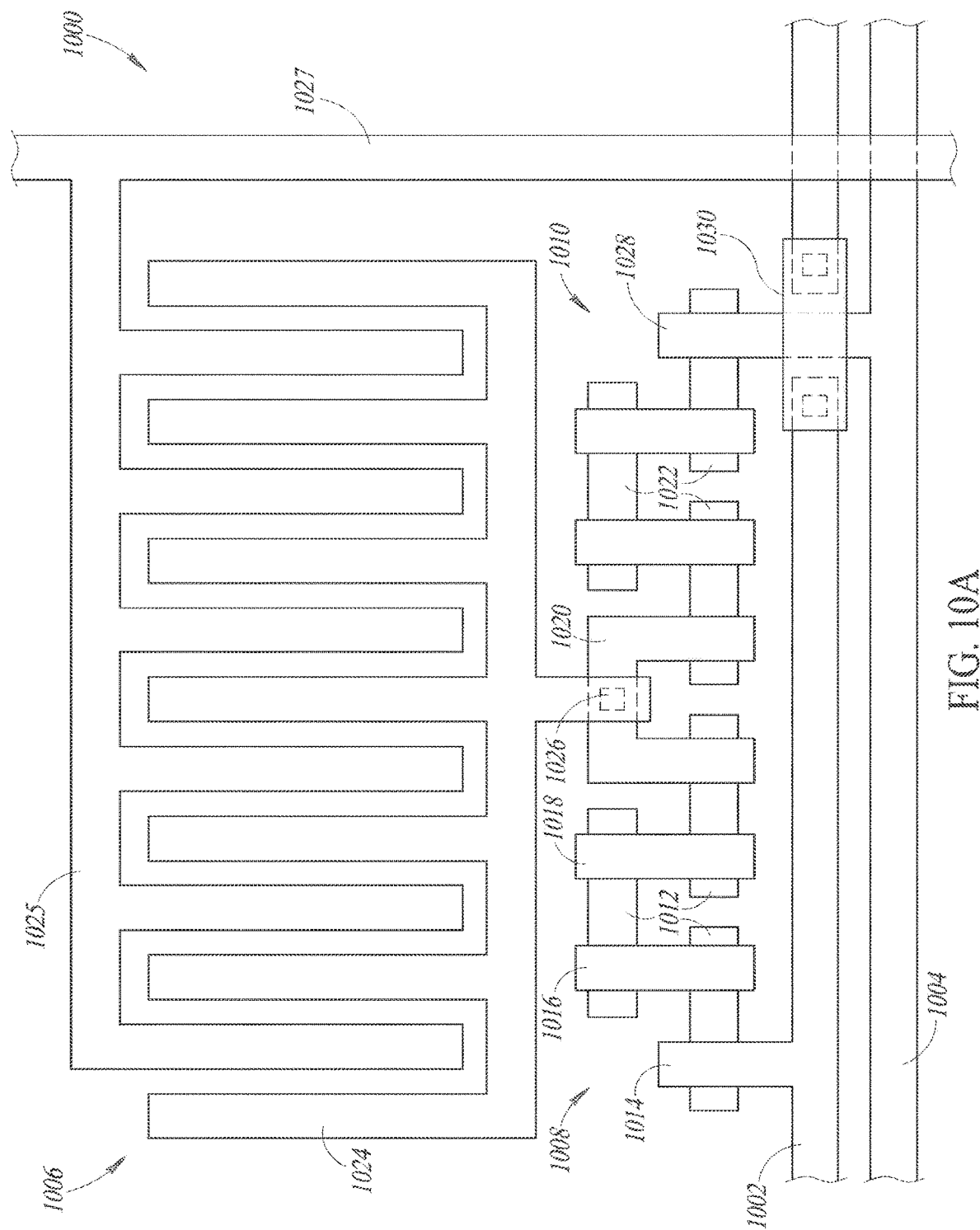
FIGS. 10A, 10B, and 10C are alternative configurations of pixels according to the present disclosure.
Figure 10B:
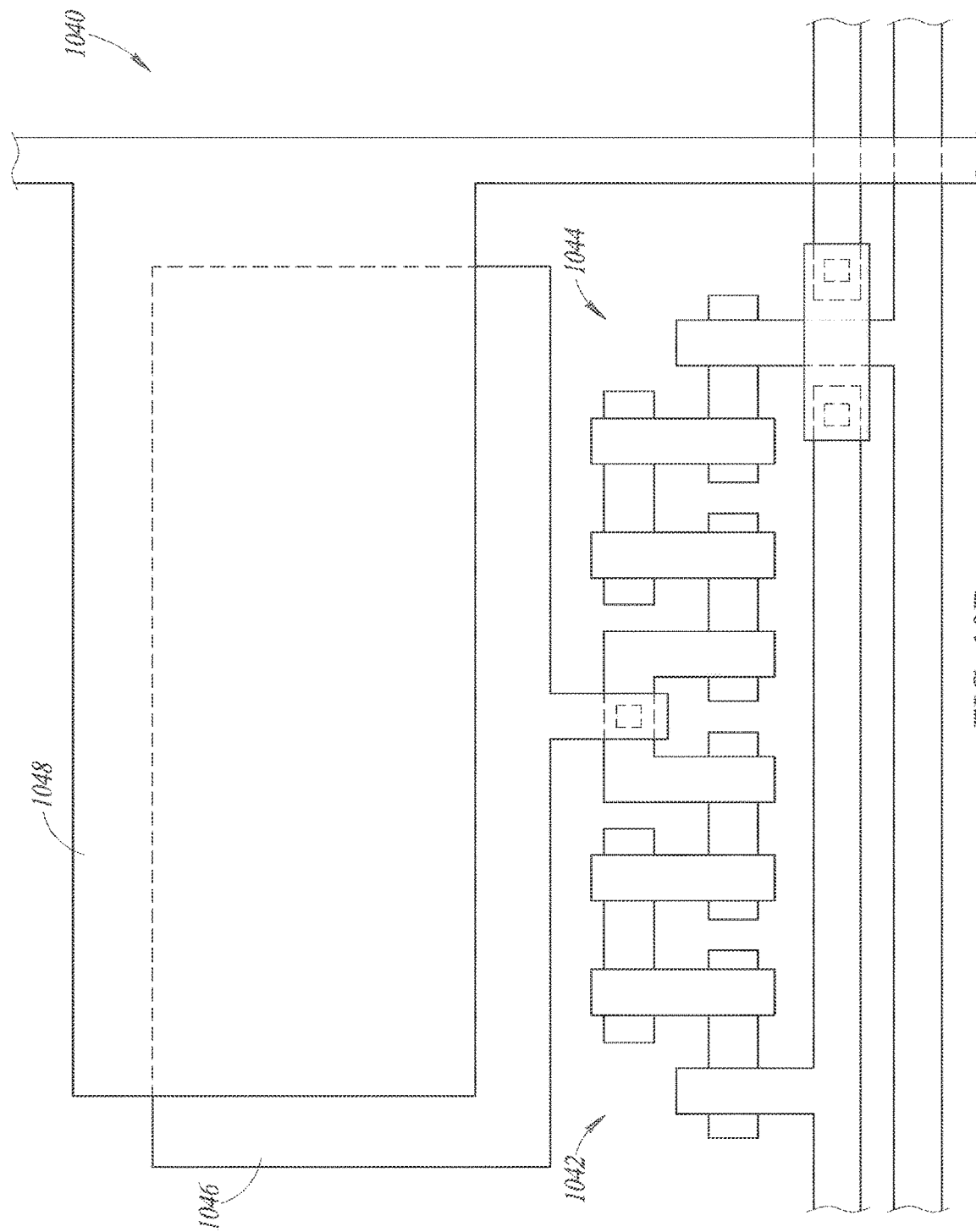
Figure 10C:
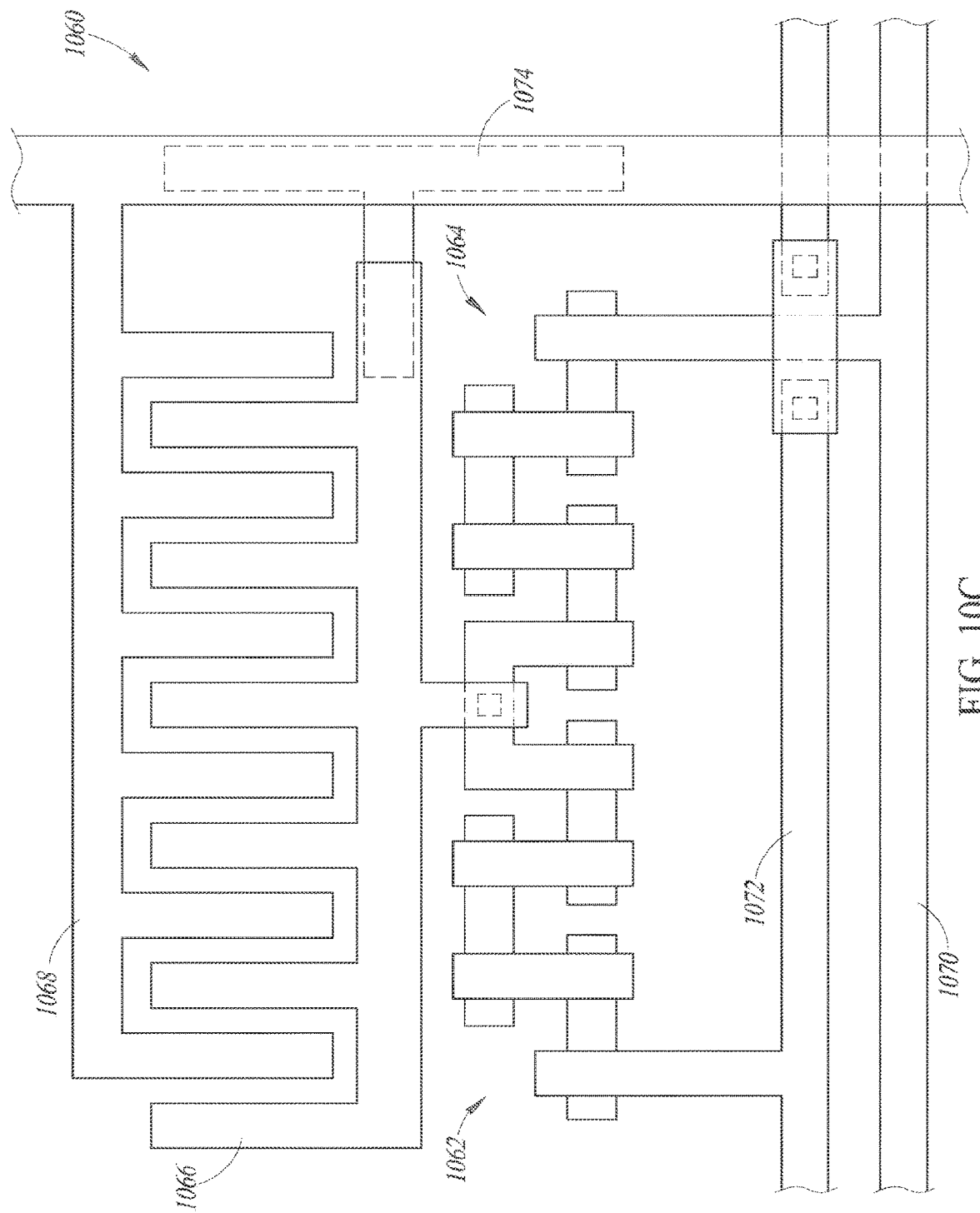

FIGS. 10A, 10B, and 10C are alternative configurations of pixels or sub-pixels according to the present disclosure. FIG. 10A is a pixel configuration 1000 that includes a first select line 1002 and a second select line 1004 on a same side of an electrode area 1006. The configuration 1000 includes a first AMNR device 1008 and a second AMNR device 1010 positioned between the first and second select lines and the electrode area 1006.

The first AMNR device 1008 includes six active areas; however other numbers are envisioned based on the voltage demands of the pixel. The six active areas are achieved by three amorphous metal interconnects 1012 formed on a substrate, which are overlapped by four conductive portions. The four conductive portions include a first portion 1014 that is an extension from the first select line 1002. A second portion 1016 overlaps two of the interconnects 1012. A third portion 1018 overlaps two of the interconnects 1012 and is substantially aligned with or parallel with the second portion. And a fourth portion 1020 overlaps one of the interconnects 1012.

The fourth portion 1020 is an inverted U-shape in that it also overlaps with one of three amorphous metal interconnects 1022 from the second AMNR device 1010. The fourth portion 1020 also is coupled to a first electrode 1024 in the electrode area through a via 1026. A second electrode 1025 has comb fingers that interact with comb fingers of the first electrode. The second electrode 1025 includes a signal line 1027 that couples to different adjacent pixels in an array.

The second AMNR 1010 includes four conductive portions similarly arranged as the first AMNR 1008 where the second select line 1004 includes a portion 1028 that overlaps one of the interconnects 1022. The first select line 1002 includes a coupling portion 1030 that allows the first select line to physically pass by the portion 1028 of the second select line to prevent shorting. This configuration may be used for vertical alignment or in-plane switching configurations.

FIG. 10B is a configuration 1040 compatible with vertical alignment where a first and second AMNR device 1042 and 1044 are formed with a similar configuration as that in FIG. 10A, such that the select lines are both on a same side of the pixel. In this configuration, the first and second electrodes 1046 and 1048 are solid, as opposed to comb fingered. This configuration includes having the first layer of the AMNR devices being an amorphous metal thin film, the second layer is a tunneling oxide, and the third layer is a different material from a pixel window.

FIG. 10C is a configuration 1060 that includes a first and second AMNR device 1062 and 1064 formed similarly to FIG. 10A. A first electrode 1066 and a second electrode 1068 are comb fingered and separated from select lines 1070, 1072 by the first and second AMNR devices. This configuration includes a capacitor 1074. The AMNR devices include the first interconnect layer (lower electrode), the tunneling oxide, and the second interconnect layer (upper electrode). The capacitor can be formed with the lower electrode aligned with the upper electrodes. As noted above, typically the lower electrodes are amorphous metal thin films due to their physical properties.

Figure 11:
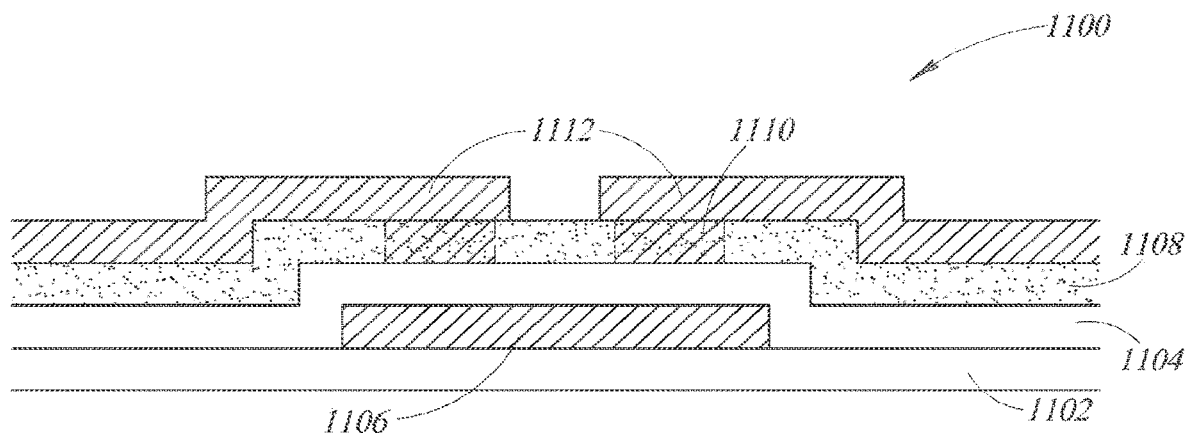
FIG. 11 is an enhanced view of a contact formed in conjunction with an alternative embodiment of the present disclosure.

FIG. 11 is an enhanced view of a contact 1110 formed in an AMNR device 1100, the contact formed in conjunction with an alternative embodiment of the present disclosure. This contact may be used in any type of AMNR device, including devices with two active areas or more than two active areas. This contact 1110 is formed in conjunction with an AMNR device 1100 formed on a substrate 1102. A lower electrode 1106 is formed on the substrate. A first tunneling insulator 1104 is formed on the lower electrode and is conformal in this embodiment. A second insulator 1108 is formed on the first insulator 1104. A via is formed in the second insulator and filled with a conductive material to form the contact 1110. An upper electrode 1112 is formed on the via and on the second insulator to achieve the overlap to form an active area. This provides the contact via for the tunnel junction such that an area for the tunnel junction is smaller than an area of overlap of the lower electrode and the upper electrode.

If lower electrode is amorphous metal thin film, then the upper electrode may be any suitable conductive film. If the lower electrode is not an amorphous metal thin film, then the upper electrode is an amorphous metal thin film.

The second insulator 1108 may be an organic color filter material, an organic non-color filter barrier, or an inorganic barrier.

Figure 12:
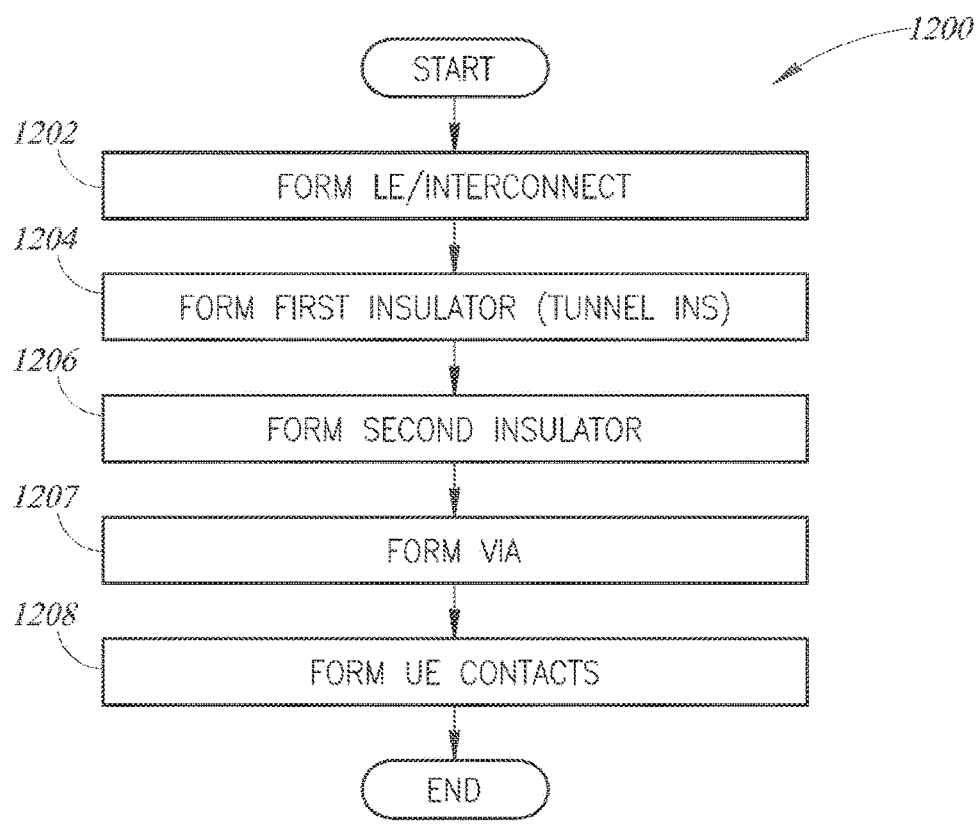
FIG. 12 is a flow chart of a process to form the contact of FIG. 11.

FIG. 12 is a flow chart of a process 1200 to form the contact 1110 of FIG. 11. At step 1202, the lower electrode or interconnect is formed. At step 1204, the first insulator is formed. At step 1206, the second insulator is formed on the first insulator. At step 1207, the via is formed in the second insulator. At step 1208, the upper electrode is formed and coupled to the via. This process allows precise selection of an area associated with the active area as dimensions of the via can be selected. The second insulator isolates the lower and upper electrodes in all locations except for the via. The second insulator may be a color filter, which allows for a color filter to be incorporated into the backplane.

Figure 13:
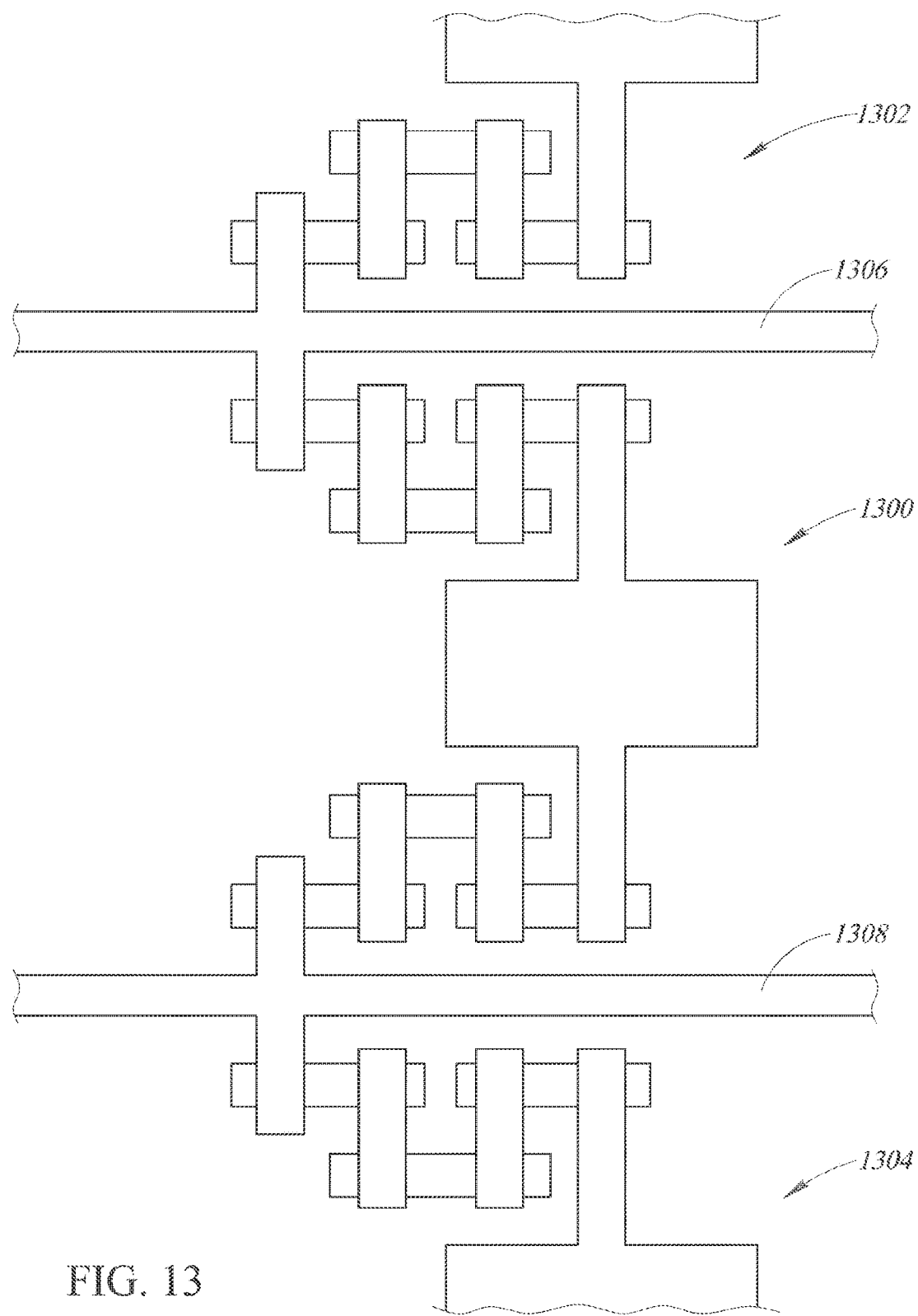
FIG. 13 is a top down view of a shared select line layout of an embodiment of the present disclosure.

FIG. 13 is a top down view of a plurality of sub-pixels that have a shared select line layout according to an embodiment of the present disclosure. A first sub-pixel 1300 is positioned between a second and a third sub-pixel 1302, 1304. Each sub-pixel needs two select lines. The first sub-pixel 1300 has a first select line 1306 shared with the second sub-pixel 1302 and a second select line 1308 shared with the third sub-pixel 1304.

Figure 14:
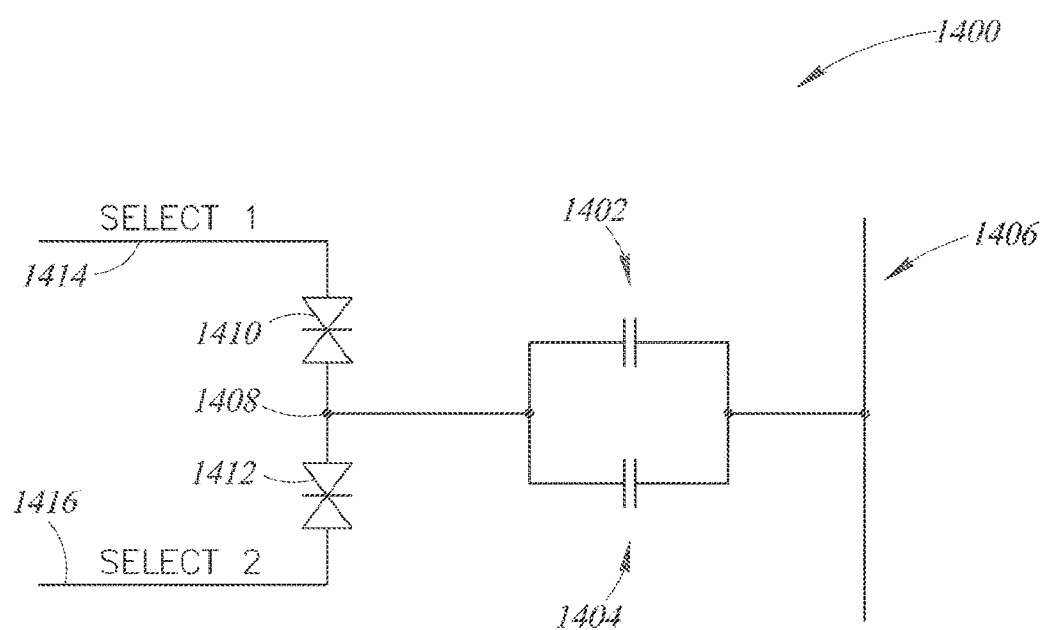
FIG. 14 is a schematic view of an in-plane switching configuration with a capacitor.

FIG. 14 is a schematic view of an in-plane switching pixel configuration 1400 with a storage capacitor 1402 integrated within the pixel. The storage capacitor 1402 is in parallel with an in-plane switching (IPS) capacitor 1404, which can be formed in accordance with the various embodiments of the present disclosure. The storage capacitor and the IPS capacitor are coupled between a data line 1406 and a node 1408 between two AMNR devices 1410, 1412. The two AMNR devices are coupled between a first select line 1414 and a second select line 1416. As will be described in more detail below, the storage capacitor can be formed below the data line to keep this device very compact.

Figure 15A:
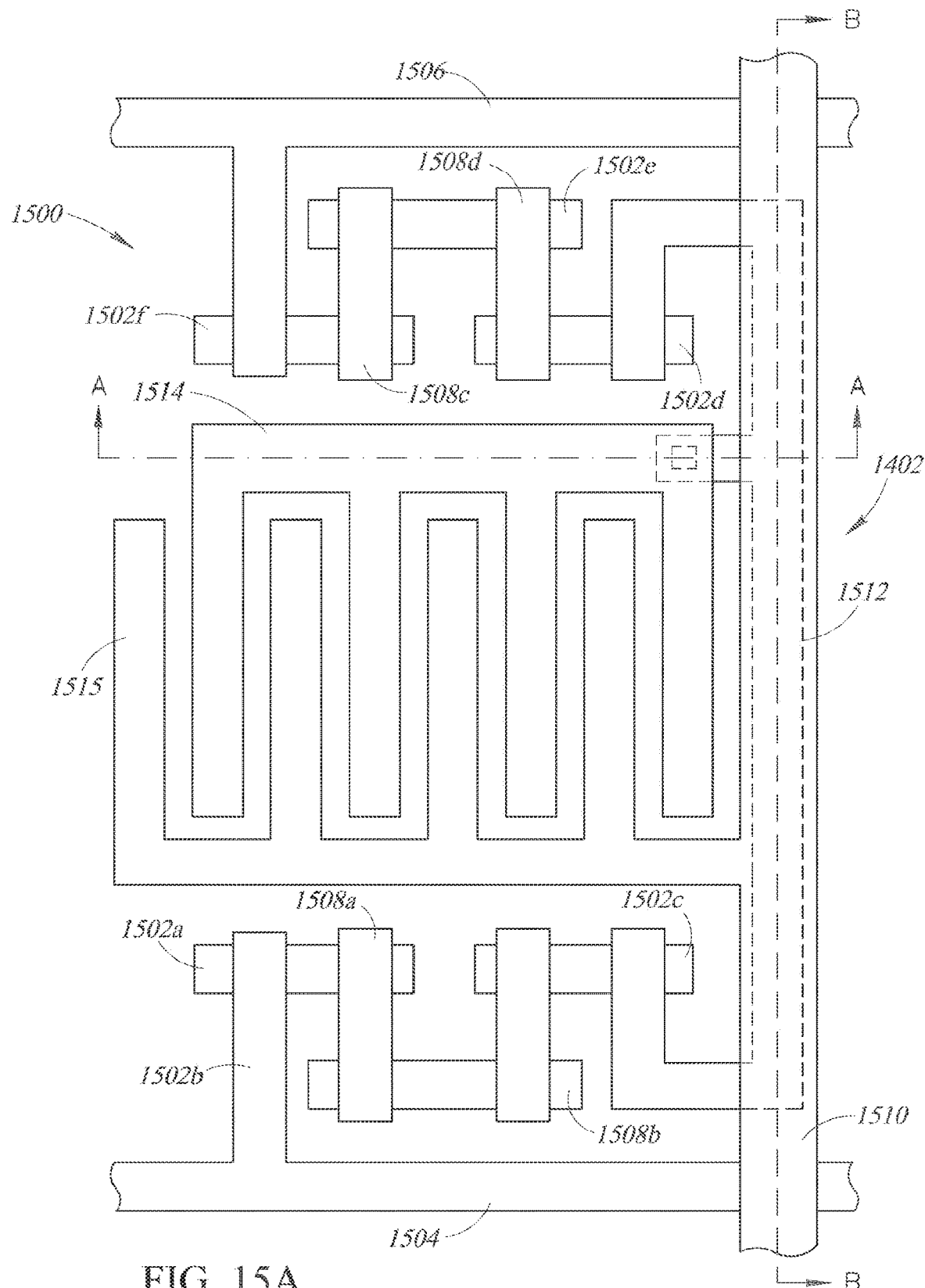
FIGS. 15A-15C are top down and cross-sectional views of an embodiment of an in-plane switching configuration of the present disclosure.
Figure 15B:
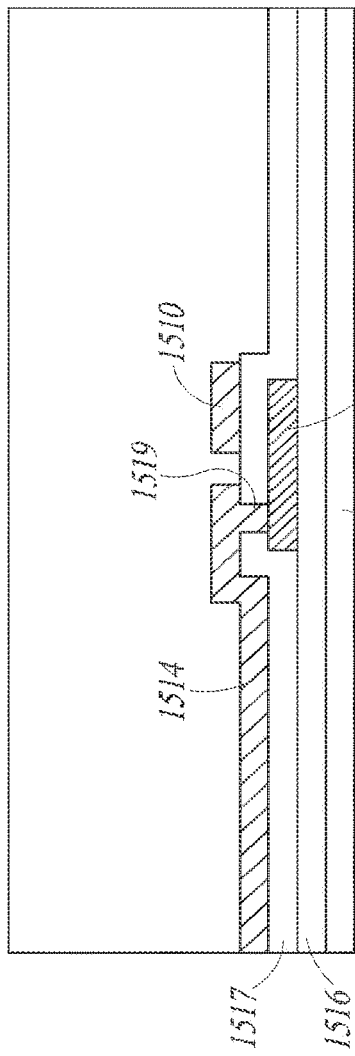
Figure 15C:
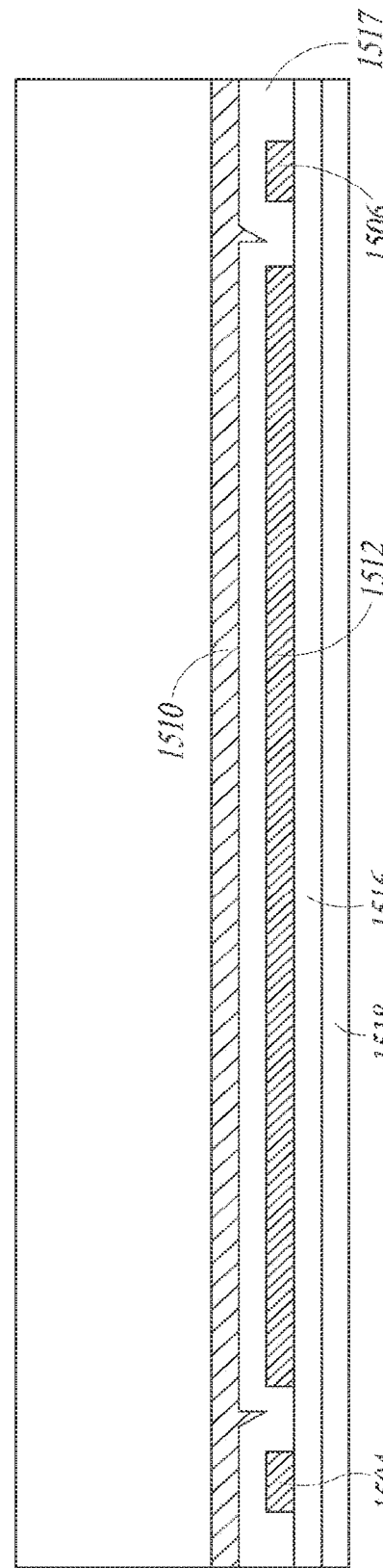
Figure 16:
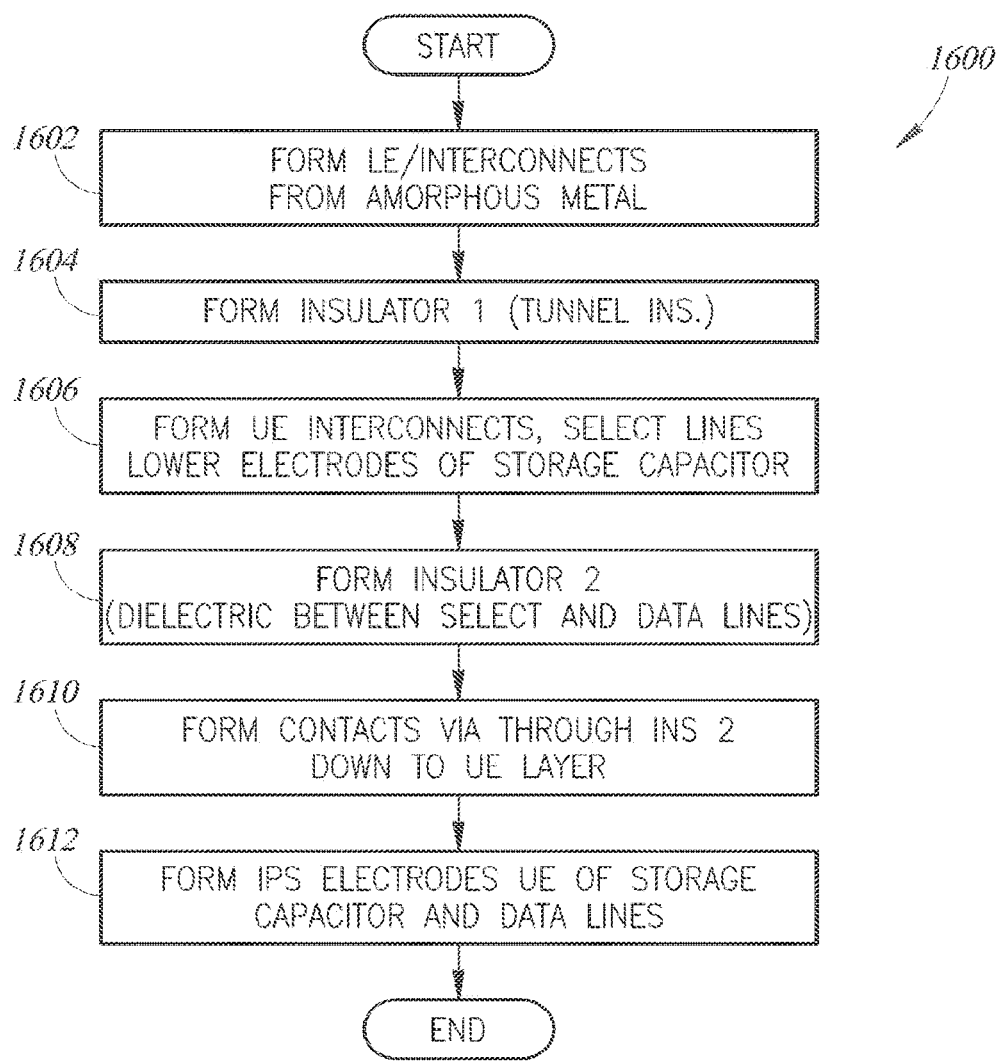
FIG. 16 is a flow chart of a process to form the configuration of FIGS. 15A-15C.

FIGS. 15A-15C are top down and cross-sectional views of an embodiment of an in-plane switching pixel configuration 1400 of FIG. 14. FIG. 16 is a flow chart of a process to form the configuration of FIGS. 15A-15C. At step 1602, lower electrodes or interconnects 1502a-1502f are formed on a substrate 1518. These lower electrodes are formed of an amorphous metal. At step 1604, a first insulator 1516 is formed. At step 1606, upper electrodes or interconnects 1508a-1508d are formed. Select lines 1504 and 1506 are formed in this step along with a first electrode 1512 of the storage capacitor 1402.

At step 1608, a second insulator 1517 is formed. At step 1610, a contact via 1519 is formed in the second insulator layer 1517 to the upper electrodes where needed, such as FIG. 15B. At step 1612, the first and second electrodes 1514 and 1515 are formed, which are in a same plane and have comb fingered features in some embodiments. A data line 1510 is also formed in this step in conjunction with a second electrode (same as the data line) of the storage capacitor. In this embodiment, the storage capacitor couples to a first AMNR device 1500 that is between the select line 1506 and the first and second electrodes. The storage capacitor also couples to a second AMNR device that is between the select line 1504 and the first and second electrodes. Two portions of the storage capacitor are extensions that overlap one of the amorphous metal interconnects and form active areas as part of the AMNR devices. In other configurations, the storage capacitor may couple to an interconnect through a via as opposed to a direct overlap of the interconnect and a portion of the storage capacitor.

Figure 17A:
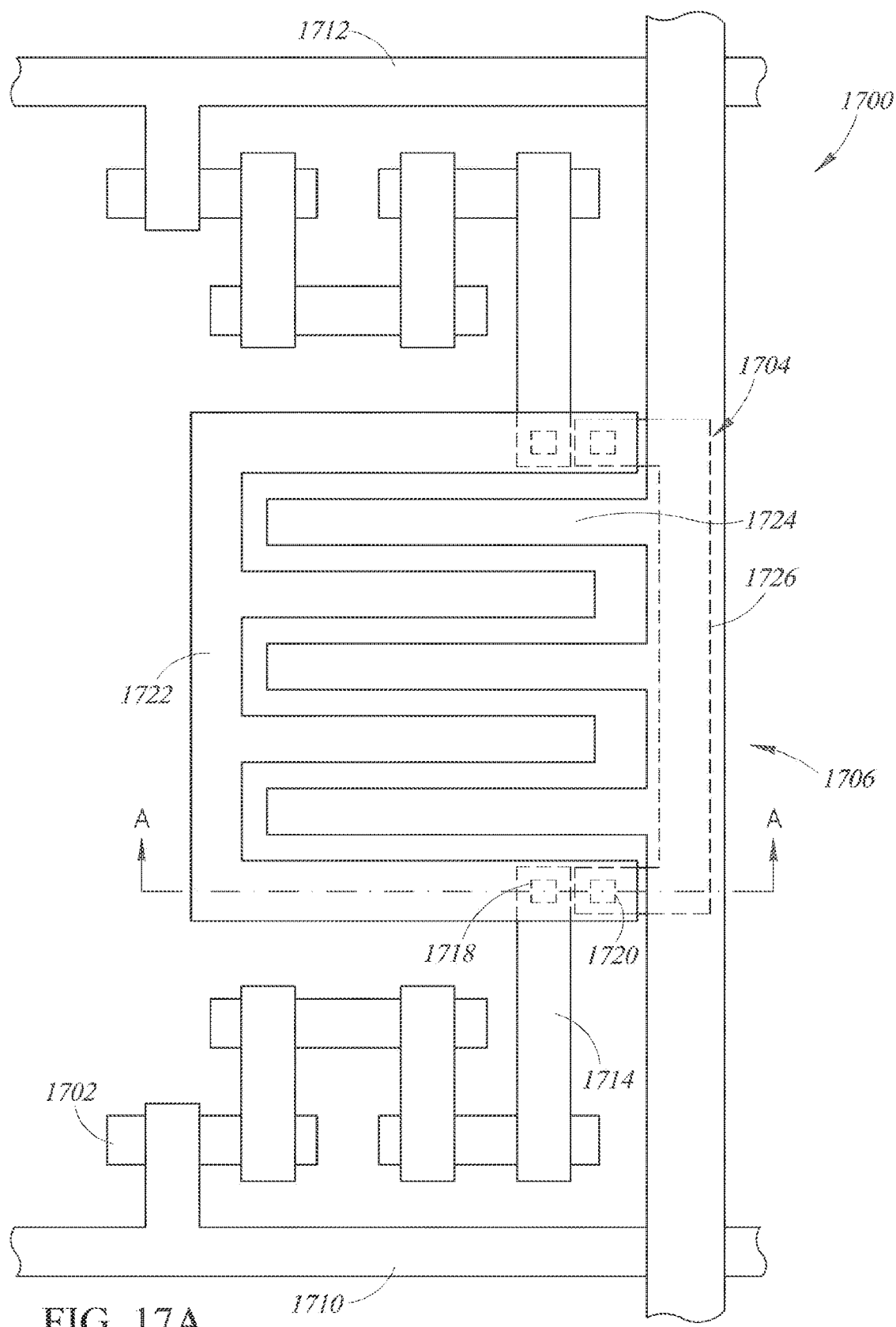
FIGS. 17A-17B are top down and cross-sectional views of an embodiment of an in-plane switching configuration of the present disclosure.
Figure 17B:
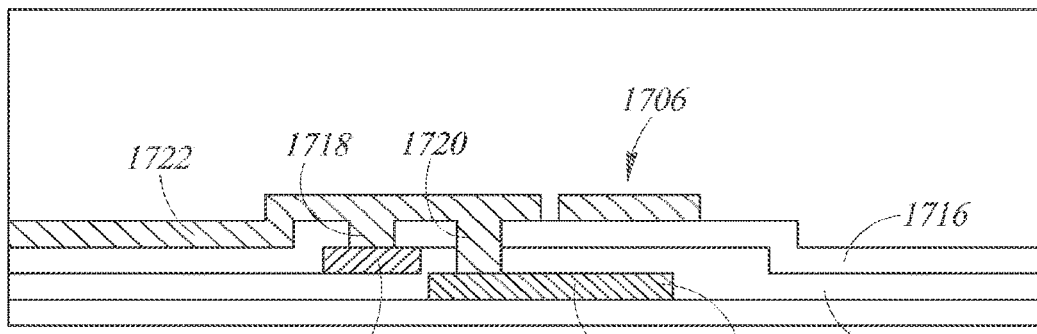
Figure 18:
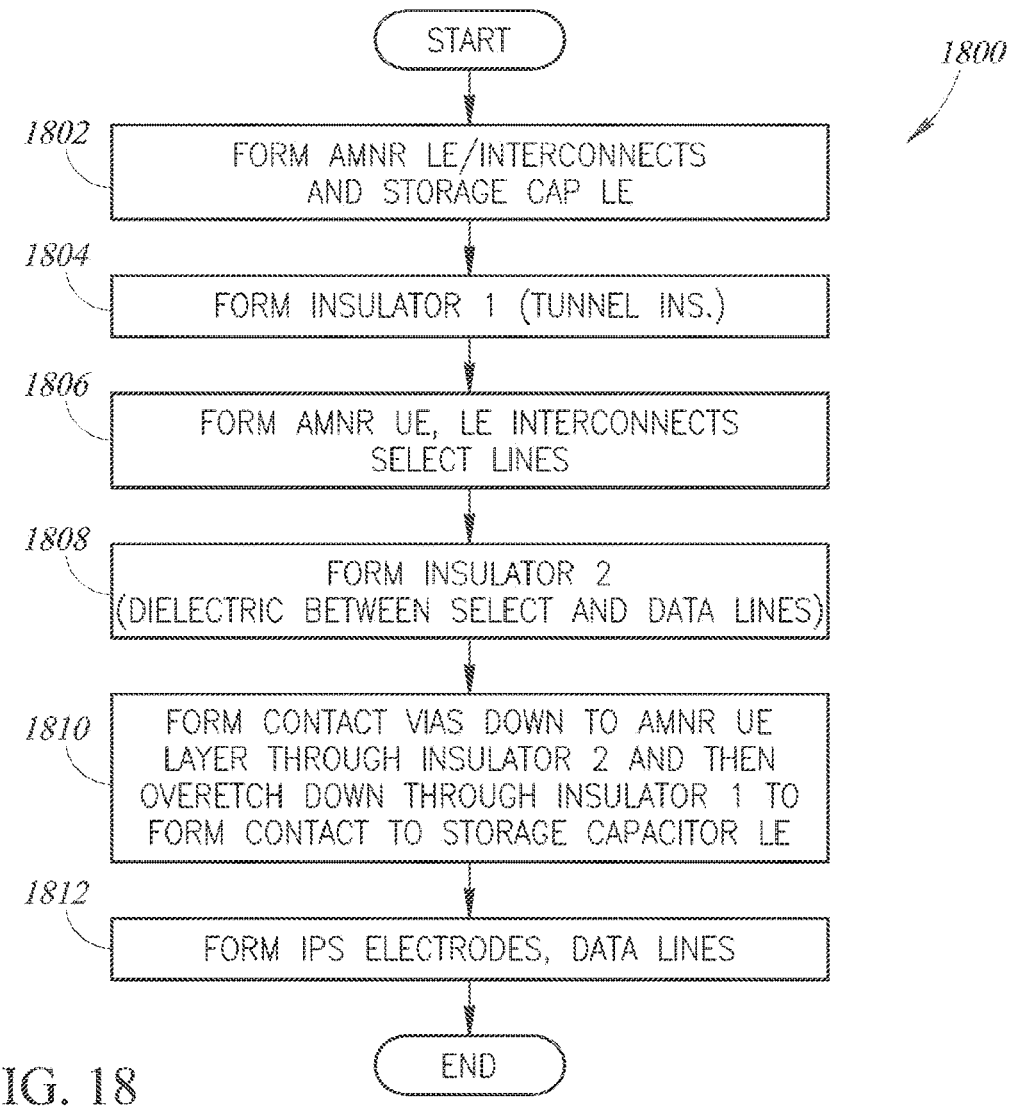
FIG. 18 is a flow chart of a process to form the configuration of FIGS. 17A-17B.

FIGS. 17A-17B are top down and cross-sectional views of an embodiment of an in-plane switching pixel configuration 1700 of the present disclosure. FIG. 18 is a flow chart of a process 1800 to form the configuration 1700 of FIGS. 17A-17B. At step 1802, lower electrodes 1702 of an amorphous metal and a lower electrode 1704 of a storage capacitor 1706 are formed.

At step 1804, a first tunneling insulator 1708 is formed. At step 1806, select lines 1710, 1712, and upper electrodes 1714 of the AMNR devices are formed. At step 1808, a second insulator 1716 is formed. This second insulator is a dielectric layer between the select lines and the data lines.

At step 1810, contact vias 1718, 1720 are formed. At step 1812, in-plane switching electrodes 1722, 1724 are formed along with data lines 1726, each of which are coupled to respective contact vias.

The amorphous metal layers may be titanium aluminum that is deposited, patterned, and etched to provide a selected shape, which is typically rectangular. These are formed as thin films that give good step coverage, have smoother surfaces, and facilitate more controllable and uniform Fowler-Nordheim operation.

The tunneling insulator may be aluminum oxide. This insulator influences the RC characteristics of the AMNR device. A thickness of this insulator directly impacts operational voltage and tunneling behavior. The upper electrodes or second interconnects may also be titanium aluminum.

An AMNR device of the present disclosure includes two terminals and includes at least a three-layer structure. These devices can be incorporated in displays to make them lighter and faster. These AMNR devices can be included in a flexible display. As these will be very light, these may be wearable displays. The three layers include an amorphous metal layer on a substrate; a tunneling insulator, e.g., an oxide layer, over the amorphous metal layer; and a conductive layer is formed on top of the oxide. The amorphous metal layer may be considered a lower electrode and the conductive layer may be considered upper electrodes. In order to have two active areas, there is one amorphous metal layer and two electrodes of the conductive layer.

When a voltage is applied between two top conductive interconnects or fingers, a tunneling current flows from the top interconnect, through the underlying amorphous metal layer, and back up to the top interconnect. By modifying the patterns of the metal electrodes relative to one another, and thus changing the overlap areas, the I-V performance characteristics of the AMNR resistor can be adjusted without modifying the insulator.

In an embodiment, the metal layers of the three-layer AMNR structure are patterned to create a number of overlapping electrodes so that more than two active areas are formed (n>2).

In an embodiment, the metal layers of the three-layer AMNR structure are inverted so that the upper metal layer is made of the amorphous metal material instead of the lower metal layer.

In an embodiment, a non-coplanar type of AMNR resistor has a five-layer structure instead of a three-layer structure. The five-layer structure includes a stack of three patterned metal electrodes—a lower electrode, a middle electrode, and an upper electrode—separated by metal oxide tunneling insulator layers. The middle electrode is made of an amorphous metal thin film. The lower and upper electrodes are made of metal thin films having a composition that is either amorphous metal, crystalline metal, or a transparent conducting oxide (TCO). The electrodes overlap one another to form two or more active areas (n≥2).

As these devices can be made very efficiently, such as covering in the range of 13% and 16% of a pixel window area, this will leave in the range of 84% and 87% of the pixel window area open for light to pass through. This is in comparison to some current techniques that only allow about 50% of the pixel window area to pass light.

The present disclosure is directed to among other things a method of making an electronic resistor that includes forming a first conductive layer on a glass substrate, the first conductive layer made of an amorphous metal; patterning the first conductive layer to form one or more lower electrodes; forming a first insulator on top of the lower electrodes; forming a second conductive layer on top of the insulator; and patterning the second conductive layer to create one or more upper electrodes, so as to form at least three active areas in which selected portions of the upper electrodes overlap selected portions of the lower electrodes.

Another embodiment of the present disclosure includes an electronic resistor that includes a glass substrate, a plurality of lower electrodes on the substrate, the lower electrodes made of an amorphous metal, an insulator on top of the lower electrodes, and a plurality of upper electrodes on top of the insulator, the upper electrodes overlapping at least three separate areas of the lower electrodes.

Another embodiment of the present disclosure includes a method of making an electronic resistor that includes forming one or more lower electrodes on a glass substrate, forming an insulator on top of the lower electrodes, forming an amorphous metal layer on top of the insulator, and patterning the amorphous metal layer to form upper electrodes so as to create two or more active areas at which selected portions of the upper electrodes overlap the lower electrodes.

Another embodiment of the present disclosure includes a method of making an electronic resistor that includes forming a lower electrode on a glass substrate; forming a first insulator on top of the first electrode; forming a middle electrode on top of the insulator, the middle electrode made of an amorphous metal; and patterning the middle electrode to create active areas in which selected portions of the middle electrode overlap the lower electrode. The method includes forming a second insulator on the middle electrode; forming an upper electrode on the second insulator; and patterning the upper electrode to create non-coplanar active areas in which selected portions of the upper electrode overlap portions of the middle electrode. The method includes patterning the electrodes creating at least three active areas at which at least two of the electrodes overlap. The method includes adjusting performance of the electronic resistor by varying the patterning of the electrodes. The first insulator has a first insulator thickness, the second insulator has a second insulator thickness, and controlling performance of the electronic resistor does not entail adjustment of either the first or the second insulator thickness.

Another embodiment of the present disclosure includes an electronic device that includes a glass substrate; a first electrode formed on the glass substrate; a second electrode on top of and partially overlapping the first electrode by a first overlap area, the first and second electrodes vertically spaced apart by a first insulating layer; and a third electrode on top of and partially overlapping the second electrode by a second overlap area, the second and third electrodes vertically spaced apart by a second insulating layer. The electronic device includes, in operation, a capacitance; and threshold voltage of the device is tunable by varying the first and second overlap areas. The first and third electrodes include one or more of an amorphous metal, a crystalline metal, or a transparent conducting oxide. The electronic device is an amorphous metal thin-film resistor having symmetric non-linear current-voltage characteristics. One or more of the electrodes is made of $Zr_{55}Cu_{30}Al_{10}N_{15}$. One or more of the insulators includes a metal oxide.

Another embodiment of the present disclosure includes an electronic device that includes a substrate; a lower electrode formed on the substrate; an upper electrode on top of and partially overlapping the lower electrode by a first overlap area, the upper electrode made of an amorphous metal thin film; and a metal oxide insulating layer separating the upper and lower electrodes, the electronic device, when in operation, exhibiting symmetric non-linear current-voltage characteristics.

A device including a substrate; a first amorphous metal thin film interconnect on the substrate having a first end and a second end; a second amorphous metal thin film interconnect having a first end and a second end, the first end of the second amorphous metal thin film interconnect being above and overlapping the first end of the first amorphous metal thin film interconnect; and a third amorphous metal thin film interconnect having a first end and a second end, the first end of the third amorphous metal thin film interconnect being above and overlapping the second end of the second amorphous metal thin film interconnect.

The second end of the first amorphous metal thin film interconnect is a first terminal and the second end of the third amorphous metal thin film interconnect is a second terminal.

The device including a fourth amorphous metal thin film interconnect on the substrate having a first end and a second end; a fifth amorphous metal thin film interconnect having a first end and a second end, the first end of the fifth amorphous metal thin film interconnect being above and overlapping the first end of the fourth amorphous metal thin film interconnect; and a sixth amorphous metal thin film interconnect having a first end and a second end, the first end of the sixth amorphous metal thin film interconnect being above and overlapping the second end of the third amorphous metal thin film interconnect.

The device including a first electrode and a second electrode, wherein the first, second, and third amorphous metal thin film interconnects are a first group and the fourth, fifth, and sixth amorphous metal thin film interconnects are a second group, the first and second electrode being between the first group and the second group.

The second end of the fourth amorphous metal thin film interconnect is a third terminal and the second end of the sixth amorphous metal thin film interconnect is a fourth terminal.

The device including a first electrode and a second electrode and a first and a second data line, the first data line being coupled to the first terminal, the first electrode being coupled between the second terminal and the third terminal, and the second data line being coupled to the fourth terminal.

A system, comprising: a first glass layer; a first and second amorphous metal thin film device on the first glass layer; a first electrode on the first glass layer, the first electrode being coupled between the first and second amorphous metal thin film devices; a second electrode; and a second glass layer, the second electrode being on the second glass layer.

The system, further comprising a liquid crystal layer positioned between the first electrode and the second electrode.

The first and second amorphous metal thin film devices each include: a first amorphous metal thin film interconnect; a second amorphous metal thin film interconnect; and a third amorphous metal thin film interconnect.

The first, second, and third amorphous metal thin film interconnects are formed on the first glass layer and a tunneling oxide is formed on the first, second, and third amorphous metal thin film interconnects.

The first and second amorphous metal thin film devices each include: a signal line that overlaps the first amorphous metal thin film interconnect; a first conductive interconnect that overlaps the first amorphous metal thin film interconnect and overlaps the second amorphous metal thin film interconnect; a second conductive interconnect that overlaps the second amorphous metal thin film interconnect and the third amorphous metal thin film interconnect, the first electrode also overlaps the third amorphous metal thin film interconnect.

The first and second conductive interconnects are an amorphous metal thin film.

The signal line of the first amorphous metal thin film device and the signal line of the second amorphous metal thin film device are separated from the first and second electrode by the first and second amorphous metal thin film devices.

The signal line of the first amorphous metal thin film device and the signal line of the second amorphous metal thin film device are separated from each other by the first and second amorphous metal thin film devices and the first and second electrodes.

A device, including a substrate; an amorphous metal thin film interconnect on the substrate; a first tunneling insulator on the amorphous metal thin film interconnect; a second insulator on the first tunneling insulator; a first conductive via through the second insulator; a conductive layer on the second insulator and coupled to the first conductive via.

The second insulator is a color filter.
The second insulator is an organic color filter material.
The second insulator is an organic non-color filter barrier.
The second insulator is an inorganic barrier.

The various embodiments described above can be combined to provide further embodiments. Aspects of the embodiments can be modified, if necessary to employ concepts of the various patents, applications and publications to provide yet further embodiments. U.S. Provisional Application 62/241,038, filed Oct. 13, 2015 is incorporated herein by reference, in its entirety. These and other changes can be made to the embodiments in light of the detailed description presented herein. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a substrate;
   a first, second, and third amorphous metal thin film interconnect on the substrate;
   a first conductive interconnect overlapping the first and second amorphous metal thin film interconnects;
   a second conductive interconnect overlapping the second and third amorphous metal thin film interconnects;
   a first terminal overlapping the first amorphous metal thin film interconnect; and
   a second terminal overlapping the third amorphous metal thin film interconnect.

2. The device of claim 1, further comprising:
   a tunneling insulator between the first, second, and third amorphous metal thin film interconnects and the first and second conductive interconnects, the tunneling insulator being between the first, second, and third amorphous metal thin film interconnects and the first and second terminals.

3. The device of claim 2 wherein the tunneling insulator comprises aluminum oxide.

4. The device of claim 1 wherein the first, second, and third amorphous metal thin film interconnects comprise titanium aluminum.

5. The device of claim 1, further comprising:
   a first active area between the first amorphous metal thin film interconnect and the first terminal;
   a second active area between the first amorphous metal thin film interconnect and the first conductive interconnect;
   a third active area between the second amorphous metal thin film interconnect and the first conductive interconnect;
   a fourth active area between the second amorphous metal thin film interconnect and the second conductive interconnect;
   a fifth active area between the third amorphous metal thin film interconnect and the second conductive interconnect; and
   a sixth active area between the third amorphous metal thin film interconnect and the second terminal.

6. The device of claim 1 wherein each of the first and second conductive interconnects and the first and second terminals is an amorphous metal thin film.

7. The device of claim 1 wherein each of the first and second conductive interconnects and the first and second terminals is a crystalline metal thin film or a transparent conductive oxide thin film.

8. The device of claim 1 wherein the first, second and third amorphous metal thin film interconnects are in a first plane, and the first and second conductive interconnects and the first and second terminals are in a second plane that is above the first plane.

9. The device of claim 1 wherein the first, second and third amorphous metal thin film interconnects are in a first plane, and the first and second conductive interconnects and the first and second terminals are in a second plane that is below the first plane.

10. A device, comprising:
    a substrate;
    an amorphous metal thin film interconnect on the substrate, the amorphous metal thin film interconnect having a first end and a second end opposite the first end;
    a first tunneling insulator on the amorphous metal thin film interconnect;
    a second insulator on the first tunneling insulator;
    a first conductive via through the second insulator and in direct contact with the first tunneling insulator; and
    a first conductive interconnect on the second insulator overlying the first end of the amorphous metal thin film interconnect, the first conductive interconnect coupled to the first conductive via.

11. The device of claim 10 wherein the second insulator is a color filter.

12. The device of claim 10 wherein the second insulator is an organic color filter material.

13. The device of claim 10 wherein the second insulator is an organic non-color filter barrier.

14. The device of claim 10 wherein the second insulator is an inorganic barrier.

15. The device of claim 10 wherein the first conductive via overlaps a portion of the first end of the amorphous metal thin film interconnect.

16. The device of claim 10, further comprising a second conductive interconnect on the second insulator overlying the second end of the amorphous metal thin film interconnect.

17. The device of claim 16, further comprising a second conductive via through the second insulator, the second conductive via coupled to the second conductive interconnect and overlapping a portion of the second end of the amorphous metal thin film interconnect.

18. A method, comprising:
- forming an amorphous metal thin film interconnect on a substrate, the amorphous metal thin film interconnect having a first end and a second end opposite the first end;
- forming a first tunneling insulator on the amorphous metal thin film interconnect;
- forming a second insulator on the first tunneling insulator;
- forming a first conductive via through the second insulator and overlapping a portion of the first end of the amorphous metal thin film interconnect, wherein the first conductive via is in direct contact with the first tunneling insulator; and
- forming a first conductive interconnect on the second insulator and coupled to the first conductive via, the first conductive interconnect overlapping the first end of the amorphous metal thin film interconnect.

19. The method of claim 18, further comprising forming a second conductive via through the second insulator, the second conductive via overlapping a portion of the second end of the amorphous metal thin film interconnect.

20. The method of claim 19, further comprising forming a second conductive interconnect on the second insulator and coupled to the second conductive via, the second conductive interconnect overlapping the second end of the amorphous metal thin film interconnect.

* * * * *